(12) United States Patent
Nobira et al.

(10) Patent No.: US 10,337,887 B2
(45) Date of Patent: Jul. 2, 2019

(54) MAGNETIC SENSOR INHIBITING INFLUENCE OF INDUCED ELECTROMOTIVE FORCE

(71) Applicant: Asahi Kasei Microdevices Corporation, Tokyo (JP)

(72) Inventors: Ryuji Nobira, Tokyo (JP); Takenobu Nakamura, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 15/659,541

(22) Filed: Jul. 25, 2017

(65) Prior Publication Data

US 2017/0322051 A1  Nov. 9, 2017

Related U.S. Application Data

(63) Continuation of application No. PCT/JP2016/086463, filed on Dec. 7, 2016.

(30) Foreign Application Priority Data

Dec. 11, 2015 (JP) ................................ 2015-242325

(51) Int. Cl.
*G01D 5/14* (2006.01)
*G01R 33/02* (2006.01)
(Continued)

(52) U.S. Cl.
CPC ............ *G01D 5/145* (2013.01); *G01R 33/02* (2013.01); *G01R 33/07* (2013.01); *G01R 33/072* (2013.01); *G01R 33/091* (2013.01); *H01L 43/06* (2013.01)

(58) Field of Classification Search
USPC .............................................. 324/207.2, 251
See application file for complete search history.

(56) References Cited

U.S. PATENT DOCUMENTS 5,942,895 A     8/1999  Popovic
2002/0021124 A1 2/2002  Schott et al.
(Continued)

FOREIGN PATENT DOCUMENTS

JP    S54-178570 U   12/1979
JP    2006-214815 A   8/2006
(Continued)

OTHER PUBLICATIONS

International Preliminary Report on Patentability for International Application No. PCT/JP2016/086463, issued by the International Bureau of WIPO dated Jun. 12, 2018.
(Continued)

*Primary Examiner* — Jay Patidar

(57) ABSTRACT

A magnetic sensor includes: a magnetic converging plate; Hall elements disposed on one surface side of the magnetic converging plate; wires connecting with the Hall elements; and a signal processing circuit that connects with these wires to receive a signal from the Hall element. Between the Hall element and the signal processing circuit, the two wires cross while being spaced apart from each other in a depth direction of a substrate, and forms a compensation loop between a cross of the two wires and the circuit, and in a planar view as seen in a depth direction, at least part of a region occupied by the compensation loop is covered by the magnetic converging plate. The compensation loop compensates an induced electromotive force caused to the closed loop formed by the wires including the Hall element.

14 Claims, 16 Drawing Sheets

(51) Int. Cl.
  *G01R 33/07*  (2006.01)
  *H01L 43/06*  (2006.01)
  *G01R 33/09*  (2006.01)

(56) References Cited

U.S. PATENT DOCUMENTS

| | | | |
|---|---|---|---|
| 2007/0290682 A1* | 12/2007 | Oohira | G01R 33/07 324/251 |
| 2012/0086444 A1 | 4/2012 | Chen | |
| 2014/0266183 A1 | 9/2014 | Nishida et al. | |

FOREIGN PATENT DOCUMENTS

| | | | |
|---|---|---|---|
| JP | 2009-150732 A | | 7/2009 |
| JP | 2010-197155 A | | 9/2010 |
| JP | 2012-047708 A | | 3/2012 |
| JP | 2012-150003 A | | 8/2012 |
| JP | 2013-228222 A | | 11/2013 |
| JP | 2016-56494 A | * | 9/2016 |

OTHER PUBLICATIONS

International Search Report for International Patent Application No. PCT/JP2016/086463, issued by the Japan Patent Office dated Mar. 7, 2017.

* cited by examiner

MAGNETIC SENSOR INHIBITING INFLUENCE OF INDUCED ELECTROMOTIVE FORCE

The contents of the following Japanese patent application are incorporated herein by reference:
 NO. 2015-242325 filed in JP on Dec. 11, 2015 and
 NO. PCT/JP2016/086463 filed on Dec. 7, 2016.

BACKGROUND

1. Technical Field

The present invention relates to a magnetic sensor.

2. Related Art

A magnetic sensor that is formed by combining a thin film-like plate consisting of a ferromagnetic body such as a Ni—Fe alloy (referred to as a magnetic converging plate) and one pair of Hall elements and detects a magnetic field parallel with a substrate (referred to as a transverse magnetic field) supporting the plate and the one pair of Hall elements has been known (for example, Patent Documents 1 to 3). This magnetic sensor utilizes a function of converting the transverse magnetic field into magnetic fields perpendicular to the substrate (referred to as vertical magnetic fields) by attracting the lines of magnetic force of the transverse magnetic field with the magnetic converging plate. Because the attraction of the lines of magnetic force by the magnetic converging plate is particularly intense in the proximities of its end parts, the Hall elements are arranged in the proximities of the end parts of the magnetic converging plate.

The directions of the vertical magnetic fields that result from the conversion of the transverse magnetic field by the magnetic converging plate are opposite in terms of the direction perpendicular to the substrate (referred to as the perpendicular direction) at two symmetrical positions that are one end and the other end of the magnetic converging plate. In view of this, the Hall elements are arranged at the two symmetrical positions, respectively. Here, if in addition to the transverse magnetic field, another magnetic field such as a background magnetic field is applied further, because the directions, in terms of the perpendicular direction, of vertical magnetic fields attributable to the other magnetic field are the same at the two symmetrical positions, only the transverse magnetic field can be detected by calculating the difference in output voltages of the two Hall elements, and thereby cancelling out output voltages due to the other magnetic field. Conversely, by calculating the sum of output voltages of the two Hall elements, and thereby cancelling out an output voltage due to the transverse magnetic field, only vertical magnetic fields of the other magnetic field can be detected.

Conventionally, such a magnetic sensor is utilized in detecting the geomagnetic field, or in detecting a magnetic field temporal changes of which are slow such as a magnetic field caused by rotation of a rotary body. However, in recent years, they are now utilized in detecting a magnetic field caused by current flowing through conductors. For example, in vector control for motors, inverters or the like, overcurrent detection, or the like, magnetic fields applied change quickly. Because of this, quick responses of magnetic sensors are now required.

Particularly in in-vehicle applications, if a magnetic sensor that is formed as a core-less sensor using a magnetic converging plate is used in place of a magnetic sensor using a magnetic collecting core that collects lines of magnetic force and Hall elements for vertical magnetic field detection, it becomes susceptible to the influence of a disturbance magnetic field (that is, a vertical magnetic field). Here, if the vertical magnetic fields are not uniform around the magnetic converging plate and the Hall elements, output voltages due to the vertical magnetic fields are not cancelled out completely in the difference in output voltages of the two Hall elements, and due to the remaining components of them, the vertical magnetic fields may possibly be detected to some extent.

Patent Document 1: Japanese Patent Application Publication No. 2012-47708
Patent Document 2: Japanese Patent Application Publication No. 2013-228222
Patent Document 3: U.S. Pat. No. 5,942,895

However, in conventional configurations, because Hall elements are arranged in the proximities of end parts of a magnetic converging plate, if wires that are connected to the Hall elements and receive Hall electromotive forces form closed loops relative to magnetic fields, induced electromotive forces are generated to the wires, and the response characteristics of the magnetic sensor are degraded. Also, in in-vehicle applications, an induced electromotive force is generated due to a disturbance magnetic field, and degradation of the response characteristics of the magnetic sensor cannot be avoided.

In view of this, an object of the present invention is to provide a magnetic sensor that inhibits the influence of an induced electromotive force caused to wires connecting with Hall elements.

SUMMARY (Item 1)
A magnetic sensor may include a magnetic converging plate.

The magnetic sensor may include an electromagnetic converting element disposed on one surface side of the magnetic converging plate.

At least two wires that connect to the electromagnetic converting element may be included.

The magnetic sensor may include a circuit that connects to the at least two wires and receives a signal from the electromagnetic converting element.

Between the electromagnetic converting element and the circuit, the at least two wires may cross while being spaced apart from each other in a direction perpendicular to the one surface of the magnetic converging plate to form a compensation loop between a cross of the at least two wires and the circuit.

In a planar view as seen in a direction perpendicular to the one surface of the magnetic converging plate, at least part of a region occupied by the compensation loop may be covered by the magnetic converging plate.

(Item 2)
At least part of the region occupied by the compensation loop may be disposed on the one surface side of a corner part of the magnetic converging plate.

(Item 3)
The compensation loop may cancel out an induced electromotive force caused to the at least two wires between the electromagnetic converting element and the cross of the at least two wires.

(Item 4)
In the planar view as seen in the direction perpendicular to the one surface of the magnetic converging plate, at least part of the electromagnetic converting element may be covered by the magnetic converging plate.

(Item 5)

The magnetic sensor may further include another magnetic converging plate disposed spaced apart from the magnetic converging plate.

The magnetic sensor may further include another electromagnetic converting element disposed on one surface side of the other magnetic converging plate.

The magnetic sensor may further include at least two other wires connecting with the other electromagnetic converting element.

The circuit may further connect with the two other wires to receive a signal from the other electromagnetic converting element, Between the other electromagnetic converting element and the circuit, the two other wires may cross in a direction parallel with one surface of the other magnetic converging plate while being spaced apart from each other in a direction crossing one surface of the other magnetic converging plate, and form another compensation loop between a cross of the two other wires and the circuit, and The magnetic converging plate, the electromagnetic converting element, the compensation loop, and the other magnetic converging unit, the other electromagnetic converting element and the other compensation loop may be arranged symmetrically about a direction parallel with one surface of the magnetic converging plate.

(Item 6)

The circuit may calculate a difference in respective output signals of the electromagnetic converting element and the other electromagnetic converting element.

(Item 7)

A magnetic sensor may include a magnetic converging plate formed on a substrate.

The magnetic sensor may include an impurity diffusion layer formed on the substrate.

The magnetic sensor may include first to fourth terminals connecting with the impurity diffusion layer.

The magnetic sensor may include a first wire connecting with the first terminal.

The magnetic sensor may include a third wire connecting with the third terminal arranged facing the first terminal.

The magnetic sensor may include a second wire connecting with the second terminal.

The magnetic sensor may include a fourth wire connecting with the fourth terminal arranged facing the second terminal.

The first wire and the third wire may cross while being spaced apart from each other in a direction perpendicular to the substrate and form a first wire loop after the cross, and at least part of a region occupied by the first wire loop is covered by the magnetic converging plate in a planar view as seen in the direction perpendicular to the substrate.

(Item 8)

The second wire and the fourth wire may cross while being spaced apart from each other in the direction perpendicular to the substrate and form a second wire loop after the cross, and at least part of a region occupied by the second wire loop may be covered by the magnetic converging plate in a planar view as seen in the direction perpendicular to substrate.

(Item 9)

The regions occupied respectively by the first wire loop and the second wire loop at least partially may overlap in the direction perpendicular to the substrate.

(Item 10)

The magnetic sensor may further include a switch connecting with the first to fourth wires.

The first wire loop may be formed between a cross of the first and third wires and the switch.

The second wire loop may be formed between a cross of the second and fourth wires and the switch.

(Item 11)

The impurity diffusion layer may be an electromagnetic converting element.

(Item 12)

The first terminal and the second terminal may face each other, and the third terminal and the fourth terminal may face each other.

(Item 13)

The first to fourth terminals and the first to fourth wires may be integrated on the substrate.

(Item 14)

A first state in which the first and third terminals are power source terminals and the second and fourth terminals are output terminals, and a second state in which the first and third terminals are output terminals and the second and fourth terminals are power source terminals may be switched over from one to the other alternately.

(Item 15)

A magnetic sensor may include an electromagnetic converting element.

The magnetic sensor may include a circuit connected with the electromagnetic converting element.

The magnetic sensor may include a wire pair connecting the electromagnetic converting element and the circuit.

The wire pair may have a compensation wiring portion which is a wiring portion that generates an induced electromotive force in a reverse direction to an induced electromotive force generated by a magnetic field being applied to a loop wiring portion including the electromagnetic converting element and a partial wire connected with the electromagnetic converting element.

(Item 16)

The wire pair may include two crossing wires, each of which overpasses or underpasses the other in their paths.

The loop wiring portion may be positioned closer to the electromagnetic converting element relative to the cross.

The compensation wiring portion may be positioned closer to the circuit relative to the cross.

According to the present invention, a magnetic sensor including a magnetic converging plate, which can inhibit the influence of induced electromotive forces caused to wires and respond quickly can be provided.

DESCRIPTION OF EXEMPLARY EMBODIMENTS

Hereinafter, through embodiments of the present invention, a magnetic detecting device (referred to as a magnetic sensor) according to the present invention will be described with reference to the figures. The embodiment(s) do(es) not limit the invention according to the claims, and all the combinations of the features described in the embodiment(s) are not necessarily essential to means provided by aspects of the invention. Mutually corresponding parts throughout all the figures are provided with the same symbols, and explanations thereof are omitted as appropriate.

As an electromagnetic converting element having an electromagnetic converting function, there is mainly a so-called symmetrical Hall element to which a spinning current method can be applied.

Figure 1:
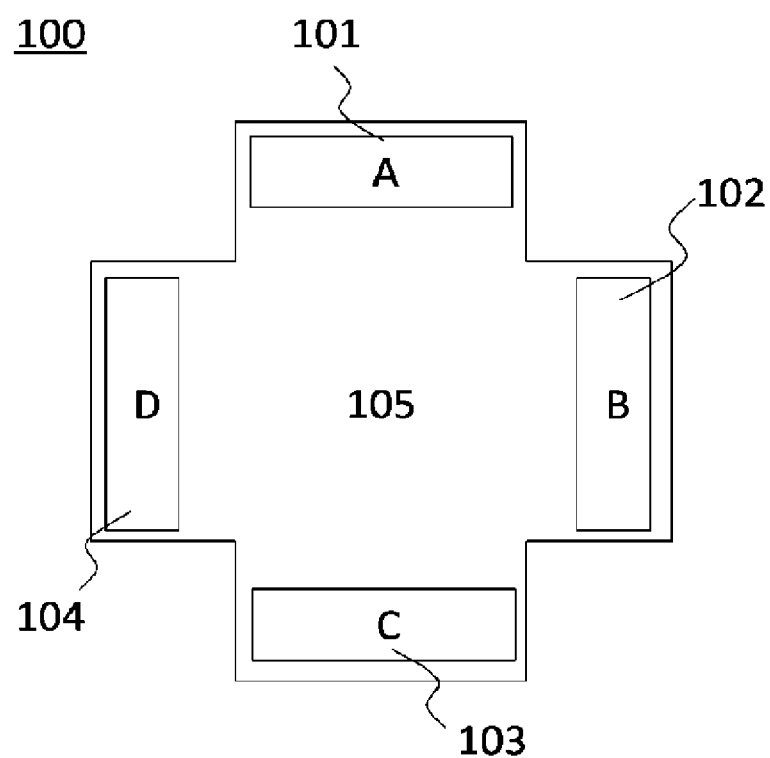
FIG. 1 shows a configuration of a cruciform symmetrical Hall element according to one embodiment.

FIG. 1 shows a configuration of a cross-shaped symmetrical Hall element. The symmetrical Hall element 100 has a cross-shaped magnetically sensitive part 105. Among four overhanging ends 101, 102, 103 and 104 of the magnetically sensitive part 105, the two overhanging ends 101 and 103 that are positioned on the top and bottom sides in the figure with the center of the magnetically sensitive part 105 being interposed therebetween are provided with Hall element power source terminals A and C, respectively, and the two overhanging ends 102 and 104 that are positioned on the right and left sides in the figure with the center of the magnetically sensitive part 105 being interposed therebetween are provided with Hall electromotive voltage output terminals B and D, respectively.

The symmetrical Hall element is a Hall element the geometric shape of which remains the same even if the arrangement of the one pair of Hall element power source terminals and the arrangement of the one pair of Hall electromotive voltage output terminals are switched, and in other words is a Hall element the entire shape of which is four-time rotation symmetrical about the axis that is perpendicular to the paper surface passing through the center (not shown in the figure). Accordingly, the symmetrical Hall element 100 can use the power source terminals as output terminals, and the output terminals as power source terminals as well. In view of this, in the present specification, the Hall element power source terminals A and C are also referred to as power source terminals or terminals A and C, and the Hall electromotive voltage output terminals B and D are also referred to as output terminals or terminals B and D.

Figure 2A:
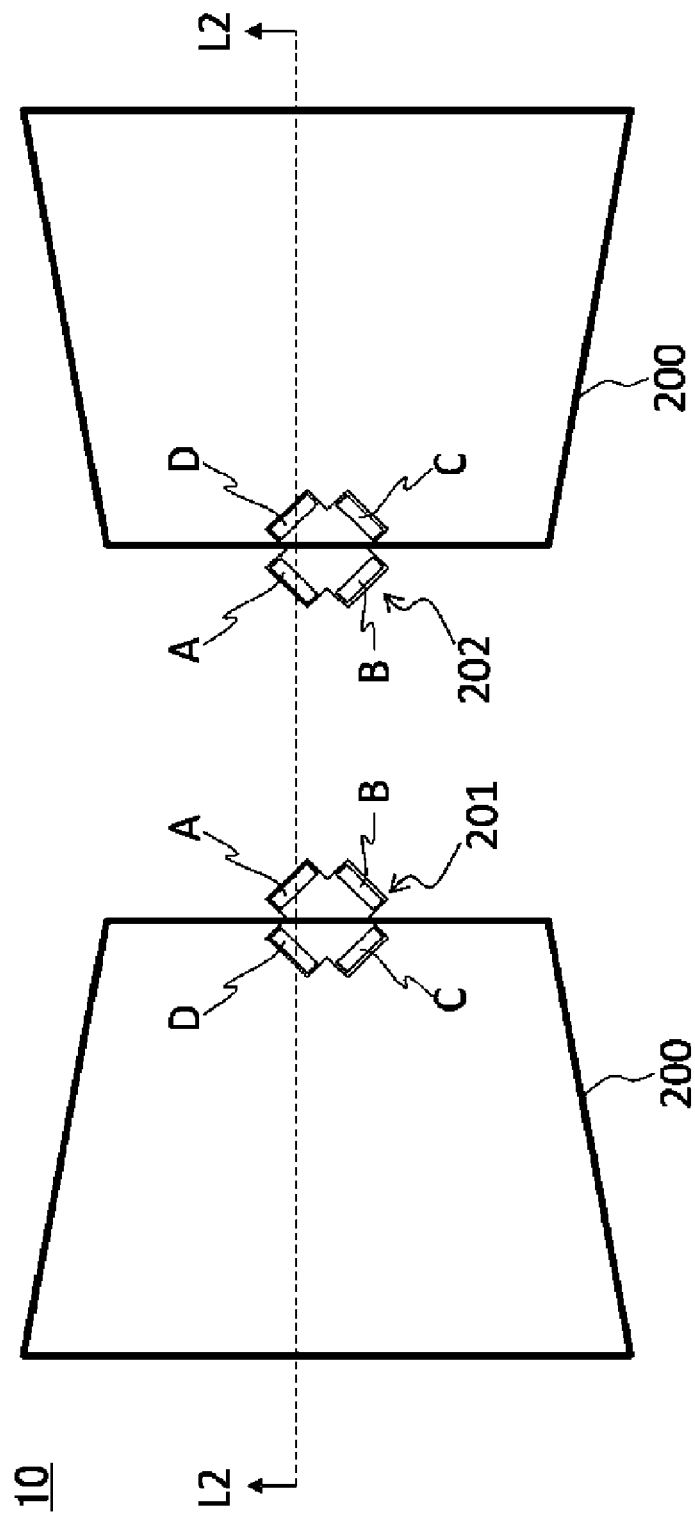
FIG. 2A shows a positional relationship among one pair of Hall elements and one pair of magnetic converging plates in a magnetic sensor according to one embodiment.
Figure 2B:
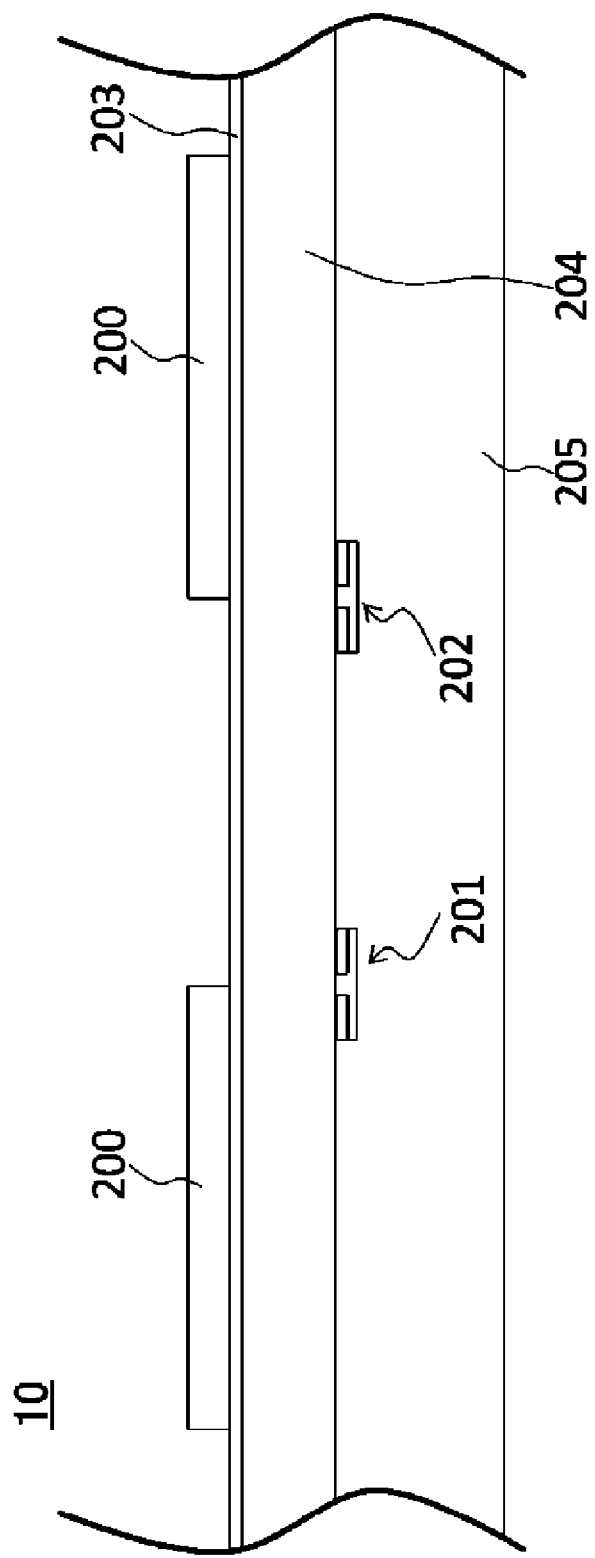
FIG. 2B is a cross-sectional view taken along a baseline L2-L2 in FIG. 2A.

FIG. 2A and FIG. 2B show a positional relationship among one pair of Hall elements and one pair of magnetic converging plates in a magnetic sensor 10 according to the present embodiment. FIG. 2A shows their positional relationship in a top view, and FIG. 2B shows their positional relationship in a cross-section taken along a baseline L2-L2 in FIG. 2A. The magnetic sensor 10 includes a substrate 205, one pair of magnetic converging plates 200 and one pair of Hall elements 201 and 202.

The substrate 205 is in one example a silicon substrate, and is provided with a wiring layer 204 and a protection film 203 on its top surface. The wiring layer 204 is an insulating layer to be provided with a wire connecting with terminals of the one pair of Hall elements 201 and 202. The protection film 203 is a thin film that covers and protects the wiring layer 204.

The one pair of magnetic converging plates 200 have isosceles trapezoid shapes, and are arranged on one side and the other side on the protection layer 203 in the left-right direction in the figure, with their respective upper sides facing each other.

The one pair of Hall elements 201 and 202 form an impurity diffusion layer on the substrate 205, have surfaces exposed flush on the top surface of the impurity diffusion layer, and are formed with their surfaces being covered by the wiring layer 204. In the Hall elements 201 and 202, the power source terminals A and C and the output terminals B and D are provided symmetrically. The one pair of Hall elements 201 and 202 are arranged at end parts of the one pair of magnetic converging plates 200, that is, directly under the upper sides of the isosceles trapezoids, respectively. Thereby, the half of the Hall element 201 including the terminals C and D is covered by one magnetic converging plate 200 and the half of the Hall element 202 including the terminals C and D is covered by the other magnetic converging plate 200.

Due to this arrangement of the one pair of Hall elements 201 and 202 relative to the one pair of magnetic converging plates 200 and these shapes of the one pair of magnetic converging plates 200, the magnetic fluxes of a transverse magnetic field oriented parallel with the substrate enter the one pair of magnetic converging plates 200 from their bases, are condensed by the tapered shapes of the isosceles trapezoids to be increased in magnetic flux density and exit from the upper sides of the magnetic converging plates 200; thereby, the transverse magnetic field is converted into highly intense vertical magnetic fields, which are to be detected by the Hall elements 201 and 202, respectively, directly under the upper sides.

Figure 3:
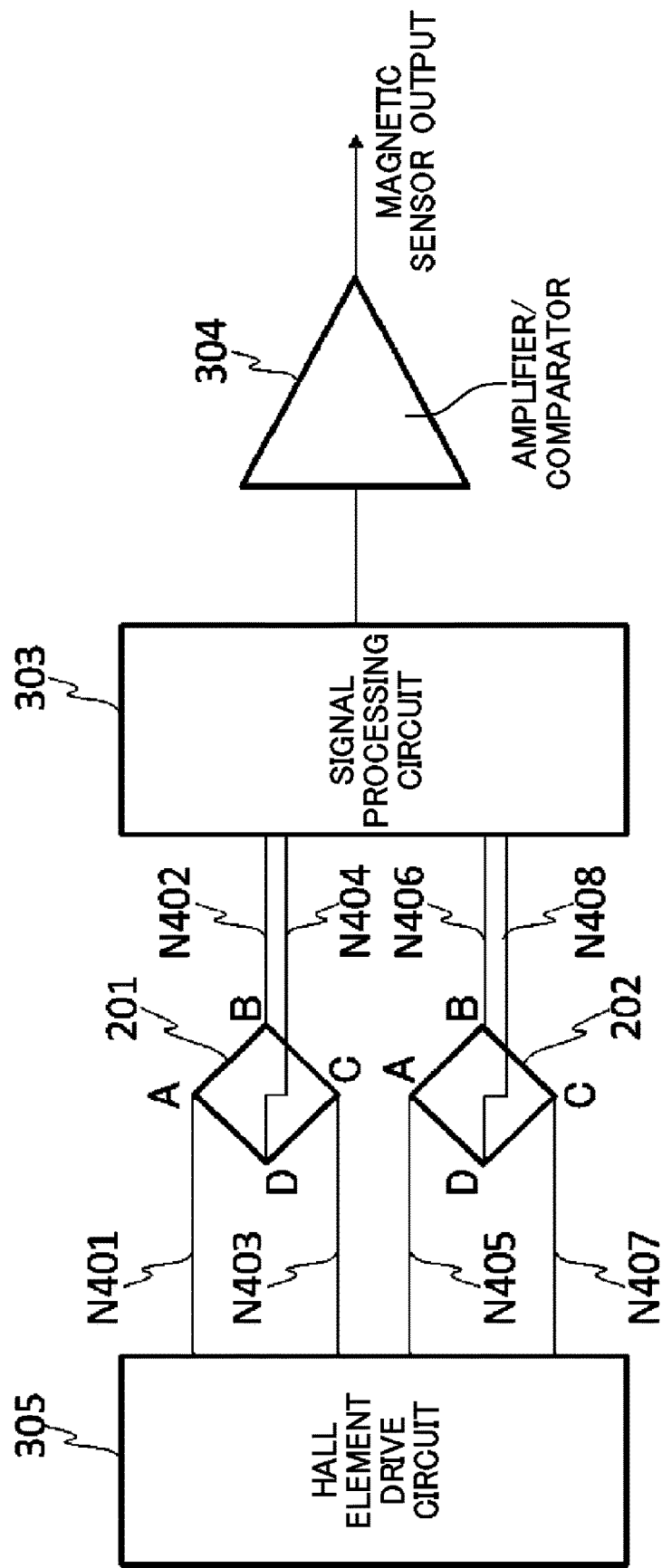
FIG. 3 is a block diagram showing a configuration of a signal processing system in a magnetic sensor according to one embodiment.

FIG. 3 shows a configuration of a signal processing system in the magnetic sensor 10 according to the present embodiment. The signal processing system includes a Hall element drive circuit 305, a signal processing circuit 303 and an amplifier or comparator 304. The Hall element drive circuit 305 connects with the power source terminals A and C of the Hall elements 201 and 202 via wires to send signals to drive the Hall elements, respectively. The signal processing circuit 303 connects with the output terminals B and D of the Hall elements 201 and 202 via wires to receive Hall electromotive forces (output signals including them) output from the respective ones, and performs operations such as addition or subtraction and outputs the results. The amplifier or comparator 304 is connected to the signal processing circuit 303, and amplifies the operation results input from the signal processing circuit 303 or compares the operation results with references to output the results as magnetic sensor outputs. The amplifier or comparator 304 may be provided with any filter and provide bandwidth control.

Figure 4A:
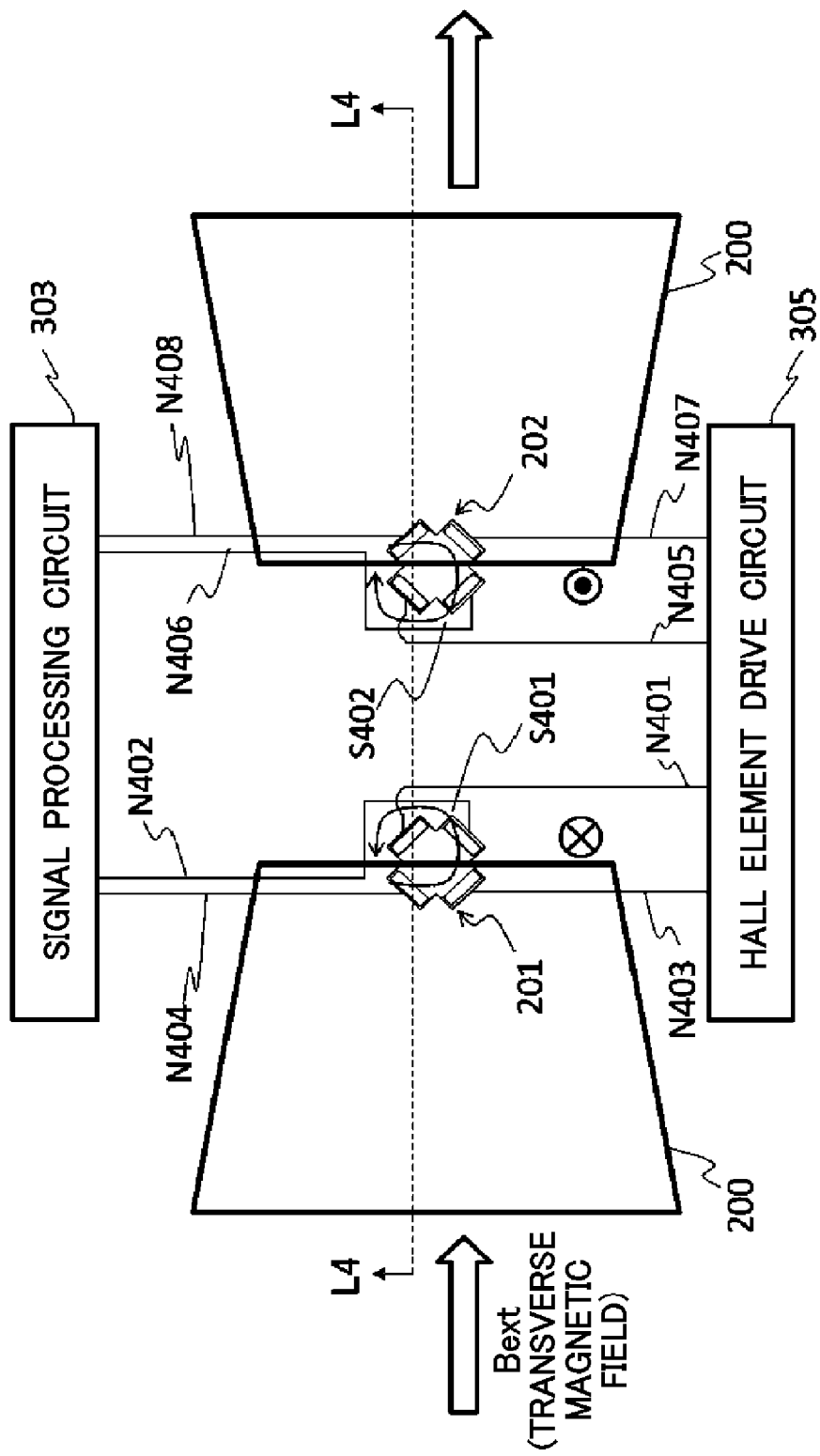
FIG. 4A shows a principle that explains how induced electromotive forces are caused by wires connecting with Hall elements.
Figure 4B:
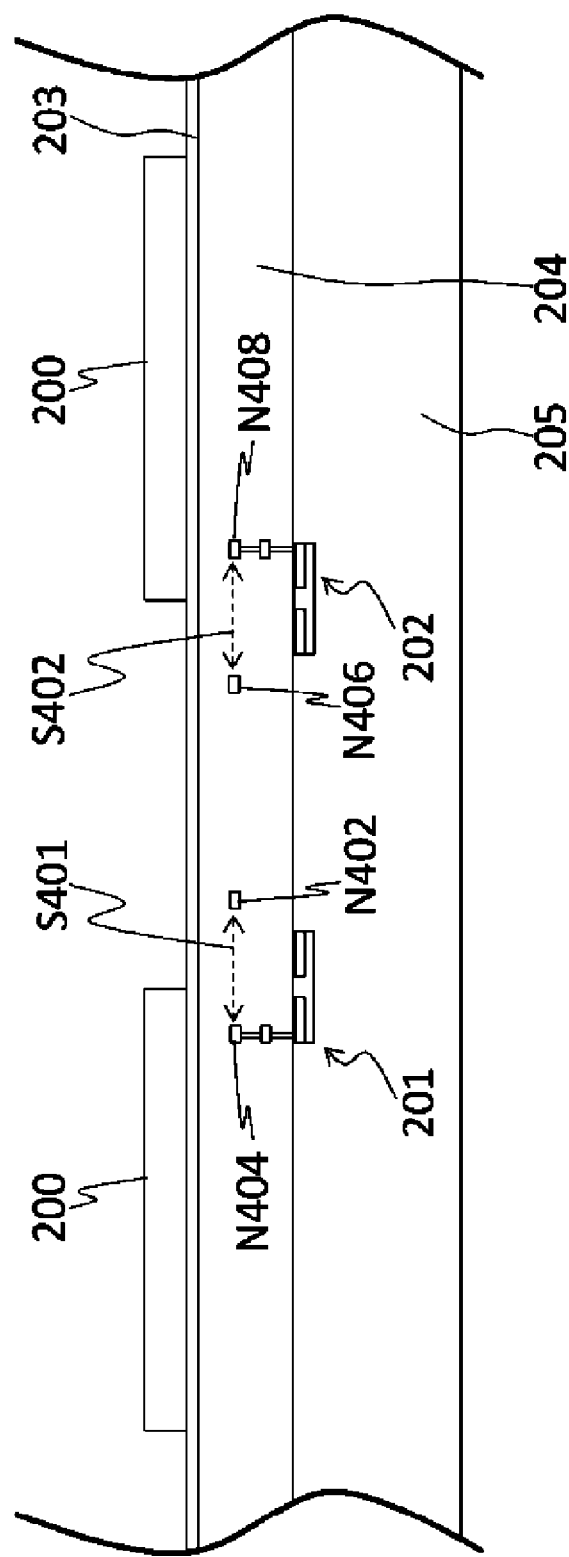
FIG. 4B is a cross-sectional view taken along a baseline L4-L4 in FIG. 4A.

FIG. 4A and FIG. 4B show a principle that explains how induced electromotive forces are caused by wires connecting with the Hall elements 201 and 202 in a conventional configuration of a magnetic sensor. Here, FIG. 4A shows in a top view the Hall element drive circuit 305 and the signal processing circuit 303 included in the signal processing system shown in FIG. 3 together with the one pair of Hall elements 201 and 202 and the one pair of magnetic converging plates 200 in the magnetic sensor 10 according to the embodiment shown in FIG. 2A. FIG. 4B shows particularly an arrangement of wires in a cross-section taken along a baseline L4-L4 in FIG. 4A. The Hall element drive circuit 305 is connected to the power source terminals A and C of the Hall element 201 by wires N401 and N403, respectively, and to the power source terminals A and C of the Hall element 202 by wires N405 and N407, respectively. The signal processing circuit 303 is connected to the output terminals B and D of the Hall element 201 by wires N402 and N404, respectively, and to the output terminals B and D of the Hall element 202 by wires N406 and N408, respectively.

The wires N402 and N404 form a closed loop region S401 including the Hall element 201 between this and the signal processing circuit 303. Also, the wires N406 and N408 form a closed loop region S402 including the Hall element 202 between this and the signal processing circuit 303. These closed loops S401 and S402 are positioned, together with the Hall elements 201 and 202, respectively, in the proximities of end parts of the magnetic converging plates 200 where magnetic flux densities are high. Here, if a transient transverse magnetic field is applied from left to right in the figure, a magnetic field enters the Hall element 201 in the direction from the near side toward the far side on the paper surface; therefore, a counterclockwise induced electromotive force is generated in the closed loop region S401 including the Hall element 201 so as to counteract this magnetic field. Also, a magnetic field enters the Hall element 202 in the direction from the far side toward the near side on the paper surface; therefore, a clockwise induced electromotive force is generated in the closed loop region S402 including the Hall element 202 so as to counteract this magnetic field.

A magnetic sensor output VO is derived. If a transverse magnetic field is to be detected, the signal processing circuit 303 calculates the difference in respective output signals V1 and V2 of the one pair of Hall elements 201 and 202. Note that in addition to a Hall electromotive force Vh1 output from the Hall element 201, the output signal Vh1 includes an induced electromotive force Vind1 caused to the closed loop region S401. That is, V1=Vh1−Vind1. Also, in addition to a Hall electromotive force Vh2 output from the Hall element 202, the output signal V2 includes an induced electromotive force Vind2 caused to the closed loop region S402. That is, V2=−Vh2+Vind2. An induced electromotive force Vind is generally given by Vind=−dψ/dt=d(BS)/dt using time t, a magnetic flux density B, and the area S of a closed loop region. Accordingly, a magnetic sensor output VO is given by Equation (1).

$$VO = V1 - V2 = (Vh1 + Vh2) - (Vind1 + Vind2) \quad (1)$$

As can be known from Equation (1), due to an induced electromotive force (Vind1+Vind2) being generated to counteract a Hall electromotive force (Vh1+Vh2) in the magnetic sensor output VO, responses of a magnetic sensor are delayed.

Furthermore, a case where vertical magnetic fields are superimposed on a transverse magnetic field is considered. Because the Hall electromotive forces Vh1v and Vh2v are caused to the Hall elements 201 and 202, and the induced electromotive forces Vind1v and Vind2v are caused to the closed loop regions S401 and S402 due to vertical magnetic fields:

Output signal V1 of the Hall element 201=(Vh1−Vind1)+(Vh1v−Vind1v)

Output signal V2 of the Hall element 202=(−Vh2+Vind2)+(Vh2v−Vind2v).

Accordingly, the magnetic sensor output VO is given by Equation (2)

$$VO = V1 - V2 = (Vh1 + Vh2) - (Vind1 + Vind2) + (Vh1v - Vh2v) - (Vind1v - Vind2v) \quad (2)$$

Here, if the one pair of magnetic converging plates 200 are arranged geometrically symmetrically, and the one pair of Hall elements 201 and 202 and the peripheral wires are arranged symmetrically, because Vh1=Vh2=Vh, Vind1=Vind2=Vind, Vh1v=Vh2v and Vind1v=Vind2v, the magnetic sensor output VO can be modified as expressed by Equation (3).

$$VO = 2Vh - 2Vind \quad (3)$$

It can be known from Equation (3) that only a transverse magnetic field can be detected even if vertical magnetic fields are superimposed on the transverse magnetic field. However, if there is misalignment of the one pair of magnetic converging plates 200, so a nonuniform vertical magnetic field is applied to the Hall elements 201 and 202, the one pair of Hall elements 201 and 202 and the peripheral wires during manufacture, components of the vertical magnetic field expressed by the third and fourth members on the right side of Equation (2) do not become zero, so the response characteristics of a magnetic sensor are further degraded.

Figure 5A:
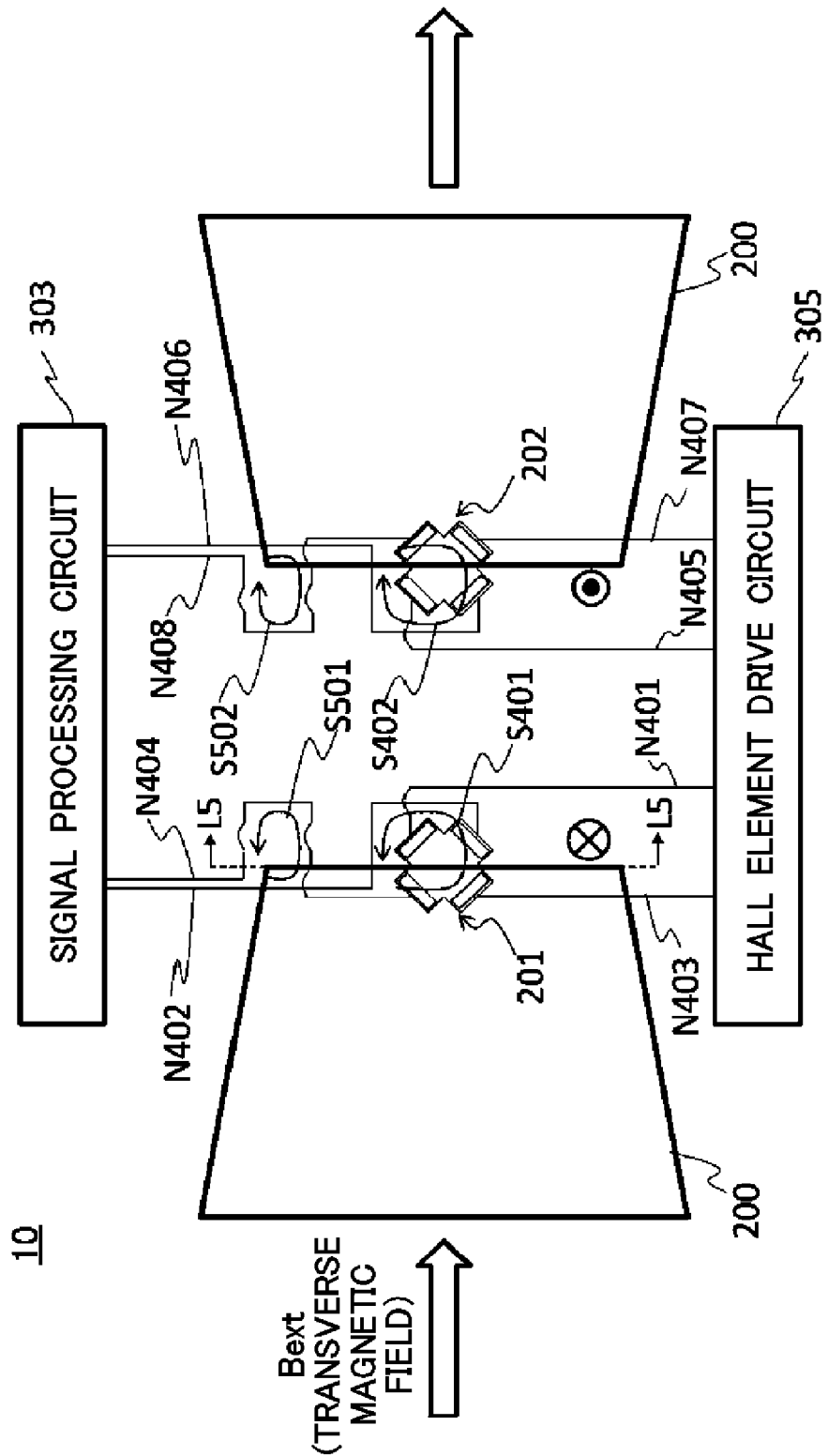
FIG. 5A shows an arrangement of one pair of compensation loop regions that cancel out induced electromotive forces in a magnetic sensor according to one embodiment.
Figure 5B:
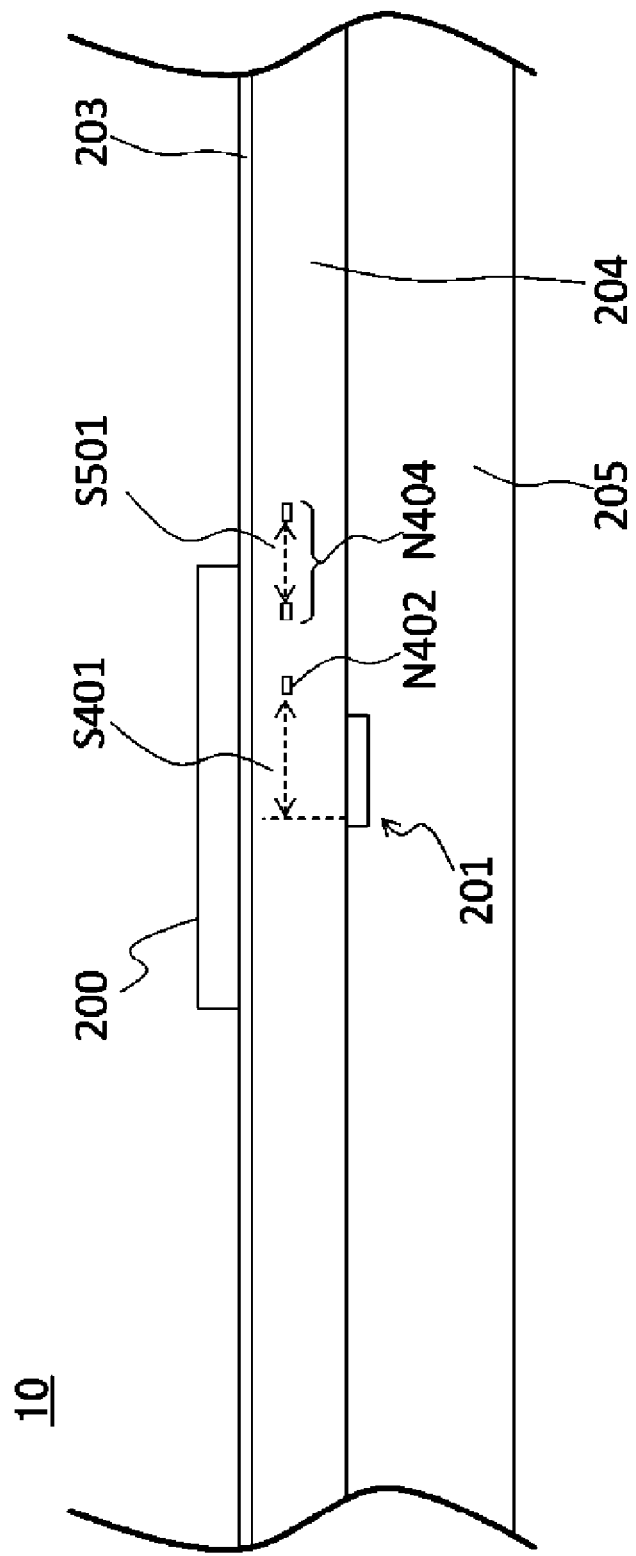
FIG. 5B is a cross-sectional view taken along a baseline L5-L5 in FIG. 5A.

FIG. 5A and FIG. 5B show an arrangement of one pair of compensation loop regions S501 and S502 that cancel out induced electromotive forces in the magnetic sensor 10 according to the present embodiment, and shows particularly a positional relationship with the one pair of Hall elements 201 and 202 and the one pair of magnetic converging plates 200. Here, FIG. 5A shows in a top view the Hall element drive circuit 305 and the signal processing circuit 303 included in the signal processing system shown in FIG. 3 together with the one pair of Hall elements 201 and 202 and the one pair of magnetic converging plates 200 in the magnetic sensor 10 according to the embodiment shown in FIG. 2A. FIG. 5B shows particularly an arrangement of the compensation loop region S501 in a cross-section taken along a baseline L5-L5 in FIG. 5A.

In the wiring layer 204, the compensation loop region S501 that compensates an induced electromotive force caused to the closed loop region S401 is formed in the wires N402 and N404 connected to the output terminals B and D of the Hall element 201, respectively. Between the Hall element 201 and the signal processing circuit 303, the wires N402 and N404 cross once in a direction parallel with the substrate 205 while being spaced apart from each other in the depth direction of the substrate 205, and forms the compensation loop region S501 between the cross and the signal processing circuit 303, particularly in the proximity of a corner part of the magnetic converging plate 200, the compensation loop region S501 including therein the corner part in a top view. In the top view, the wires N402 and N404 has the crossing point, and in a cross-sectional view, the wires N402 and N404 are spaced apart from each other at the crossing point in the depth direction. That is, the wires N402 and N404 are in a skew positional relationship. Here, at least part of a region occupied by the compensation loop region S501 is covered by the magnetic converging plate 200 in a planar view as seen in the depth direction of the substrate 205.

Likewise, in the wiring layer 204, the compensation loop region S502 that compensates an induced electromotive force caused to the closed loop region S402 is formed in the wires N406 and N408 connected to the output terminals B and D of the Hall element 202, respectively. Between the Hall element 202 and the signal processing circuit 303, the wires N406 and N408 cross once in a direction parallel with the substrate 205 while being spaced apart from each other in the depth direction of the substrate 205, and forms the compensation loop region S502 between the cross and the signal processing circuit 303, particularly in the proximity of a corner part of the magnetic converging plate 200, the compensation loop region S502 including therein the corner part in a top view. Here, at least part of a region occupied by the compensation loop region S502 is covered by the magnetic converging plate 200 in a planar view as seen in the depth direction of the substrate 205.

A principle that explains how an induced electromotive force caused to the closed loop region S401 is compensated by the compensation loop region S501 is explained.

It is assumed that as shown in FIG. 5A, a transient transverse magnetic field is applied from left to right in the figure. The transverse magnetic field is converted into a vertical magnetic field by the magnetic converging plate 200 on the left side in the figure, and enters the Hall element 201, that is, the closed loop region S401 from the near side toward the far side on the paper surface and enters the compensation loop region S501 as well. Thereby, counter-clockwise induced electromotive forces are generated to both the closed loop region S401 and the compensation loop region S501 so as to counteract the magnetic field. Here, the wires N402 and N404 forming the closed loop region S401 and the compensation loop region S501 cross once between the closed loop region S401 and the compensation loop region S501. Accordingly, the induced electromotive force caused to the compensation loop region S501 is in a direction different from that of the induced electromotive force caused to the closed loop region S401 and cancels it out.

Also, the transverse magnetic field is converted into a vertical magnetic field by the magnetic converging plate 200 on the right side in the figure, and enters the Hall element 202, that is, the closed loop region S402 from the far side toward the near side on the paper surface and enters the compensation loop region S502 as well. Thereby, clockwise induced electromotive forces are generated to both the closed loop region S402 and the compensation loop region S502 so as to counteract the magnetic field. Here, the wires N406 and N408 forming the closed loop region S402 and the compensation loop region S502 cross once between the closed loop region S402 and the compensation loop region S502. Accordingly, the induced electromotive force caused to the compensation loop region S502 is in a direction different from that of the induced electromotive force caused to the closed loop region S402 and cancels it out.

The compensation loop regions S501 and S502 are desirably arranged toward the directions the same as those of the closed loop regions S401 and S402 to which compensation target induced electromotive forces are generated. Also, the compensation loop regions S501 and S502 are desirably arranged in the proximities of corner parts of the magnetic converging plates 200. Thereby, magnetic fields having higher intensities than magnetic fields entering the closed loop regions S401 and S402 enter the compensation loop regions S501 and S502, and induced electromotive forces caused to the closed loop regions S401 and S402 can be cancelled out with small loops. Also, if magnetic fields in directions different from directions of magnetic fields entering the closed loop regions S401 and S402 enter the compensation loop regions S501 and S502, the number of times of crossing of wires may be set to zero or two.

The magnetic sensor output VO in a case where induced electromotive forces caused to the closed loop regions S401 and S402 are compensated by the compensation loop regions S501 and S502 is derived. Assuming that induced electromotive forces generated to the compensation loop regions S501 and S502 are Vind1c and Vind2c:

Output signal $V1$ of the Hall element 201=Vh1−Vind1+Vind1c

Output signal $V2$ of the Hall element 202=−Vh2+Vind2−Vind2c

Accordingly, if a transverse magnetic field is to be detected, the signal processing circuit 303 calculates the difference in respective output signals V1 and V2 of the one pair of Hall elements 201 and 202; thereby, the magnetic sensor output VO is given by Equation (4).

$$VO=V1-V2=(\text{Vh1}+\text{Vh2})-(\text{Vind1}-\text{Vind1}c)-(\text{Vind2}-\text{Vind2}c) \quad (4)$$

As can be known from Equation (4), in the magnetic sensor output VO, induced electromotive forces caused to the closed loop region S401 and S402 are cancelled out by induced electromotive forces caused to the compensation loop regions S501 and S502, and the response characteristics of the magnetic sensor 10 can be compensated.

Furthermore, a case where vertical magnetic fields are superimposed on a transverse magnetic field is considered. Assuming that induced electromotive forces caused to the compensation loop regions S501 and S502 due to vertical magnetic fields are Vind1vc and Vind2vc:

Output signal $V1$ of the Hall element 201=(Vh1−Vind1+Vind1c)+(Vh1v−Vind1v+Vind1vc)

Output signal $V2$ of the Hall element 202=(−Vh2+Vind2−Vind2c)+(Vh2v−Vind2v+Vind2vc)

Accordingly, a magnetic sensor output VO is given by Equation (5).

$$VO=(\text{Vh1}+\text{Vh2})-(\text{Vind1}-\text{Vind1}c)-(\text{Vind2}-\text{Vind2}c)+(\text{Vh1}v-\text{Vh2}v)-(\text{Vind1}v-\text{Vind1}vc)-(\text{Vind2}v-\text{Vind2}vc) \quad (5)$$

Here, if the one pair of magnetic converging plates 200 are arranged geometrically symmetrically, the one pair of Hall elements 201 and 202 and the peripheral wires are also arranged symmetrically, and induced electromotive forces caused to the closed loop regions S401 and S402 are completely cancelled out by the compensation loop regions S501 and S502, because Vind1=Vind1c, Vind2=Vind2c, Vind1v=Vind1vc and Vind2v=Vind2vc, the magnetic sensor output VO can be modified as expressed by Equation (6).

$$VO=2Vh \qquad (6)$$

It can be known from Equation (6) that only a transverse magnetic field can be detected and the response characteristics of the magnetic sensor 10 can be compensated even if vertical magnetic fields are superimposed on the transverse magnetic field. Also, it can be known that even if a nonuniform vertical magnetic field is applied to the Hall elements 201 and 202 due to misalignment of the one pair of magnetic converging plates 200, the one pair of Hall elements 201 and 202 and the peripheral wires during manufacture, degradation of the response characteristics of the magnetic sensor 10 can be inhibited.

In place of the crossing wires N402 and N404 each overpassing or underpassing the other, or in addition to this feature, for example, at least one of the wires N402 and N404 may be provided with a compensation wiring portion such as a winding to generate an induced electromotive force in a reverse direction to an induced electromotive force caused to the closed loop region S402 due to a magnetic field being applied thereto.

Figure 6:
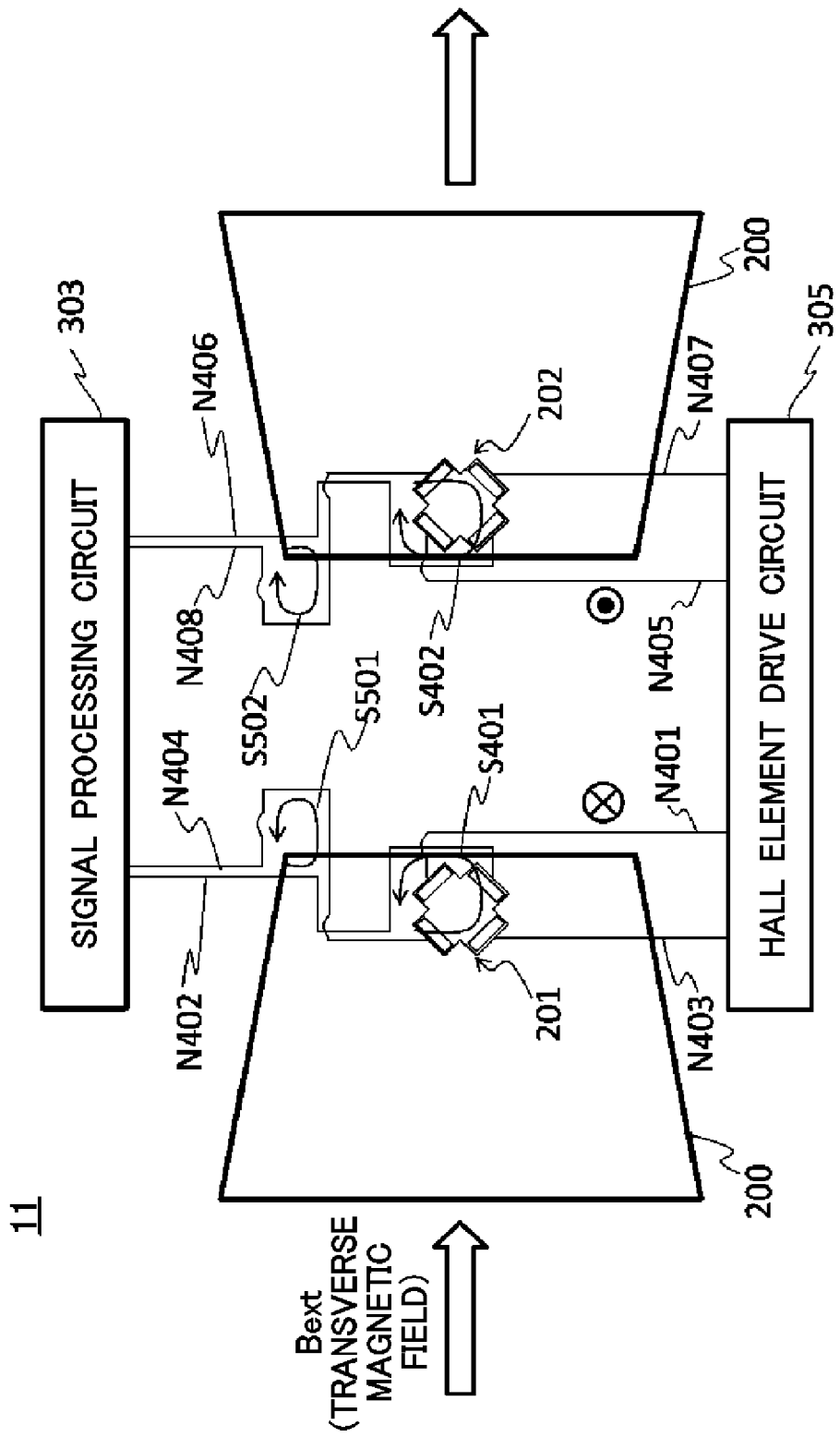
FIG. 6 shows a positional relationship among one pair of Hall elements, one pair of magnetic converging plates and one pair of compensation loop regions in a magnetic sensor according to a variant.

FIG. 6 shows a positional relationship among the one pair of Hall elements 201 and 202, the one pair of magnetic converging plates 200 and the one pair of compensation loop regions S501 and S502 in a magnetic sensor 11 according to a variant. Here, FIG. 6 shows in a top view the Hall element drive circuit 305 and the signal processing circuit 303 included in the signal processing system shown in FIG. 3 together with the one pair of Hall elements 201 and 202 and the one pair of magnetic converging plates 200 in the magnetic sensor 10 according to the embodiment shown in FIG. 2A. In the magnetic sensor 11 according to the variant, the Hall elements 201 and 202 are entirely arranged directly under the magnetic converging plates 200. In other respects, it is similar to the above-mentioned magnetic sensor 10. The compensation loop regions S501 and S502 are desirably arranged such that the directions of magnetic fields entering them become the same as directions of magnetic fields entering the closed loop regions S401 and S402 to which compensation target induced electromotive forces are generated.

Here, if each component is heated by heat entering from the outside of the magnetic sensor 11, particularly large thermal stresses are generated in the close proximities of end parts of the magnetic converging plates 200 due to the difference in the coefficients of thermal expansion of the magnetic converging plates 200 and the substrate 205. In view of this, in the magnetic sensor 11 according to the variant, the Hall elements 201 and 202 are arranged in the proximities of end parts of the magnetic converging plates 200 which are spaced apart from the close proximities of the end parts of the magnetic converging plates 200 where large thermal stresses are generated, but magnetic fields converted into highly intense vertical magnetic fields can enter.

Figure 7:
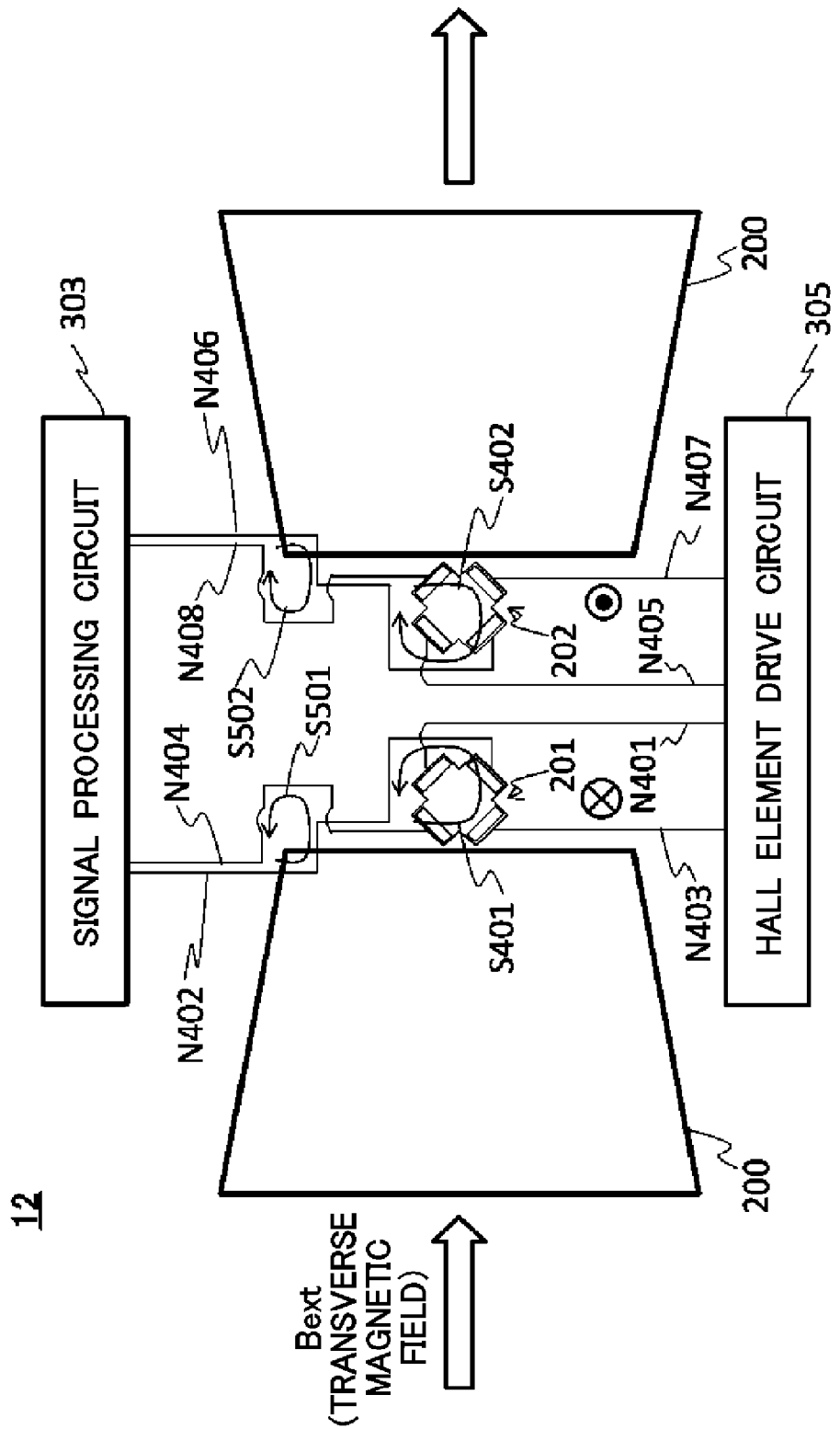
FIG. 7 shows a positional relationship among one pair of Hall elements, one pair of magnetic converging plates and one pair of compensation loop regions in a magnetic sensor according to a second variant.

FIG. 7 shows a positional relationship among the one pair of Hall elements 201 and 202, the one pair of magnetic converging plates 200 and the one pair of compensation loop regions S501 and S502 in a magnetic sensor 12 according to a second variant. Here, FIG. 7 shows in a top view the Hall element drive circuit 305 and the signal processing circuit 303 included in the signal processing system shown in FIG. 3 together with the one pair of Hall elements 201 and 202 and the one pair of magnetic converging plates 200 in the magnetic sensor 10 according to the embodiment shown in FIG. 2A. In the magnetic sensor 12 according to the second variant, the Hall elements 201 and 202 are entirely kept away from directly under the magnetic converging plates 200, and arranged between the one pair of magnetic converging plates 200 in a top view. In other respects, it is similar to the magnetic sensor 11 according to the first variant. The compensation loop regions S501 and S502 are desirably arranged such that the directions of magnetic fields entering them become the same as directions of magnetic fields entering the closed loop regions S401 and S402 to which compensation target induced electromotive forces are generated.

Figure 8:
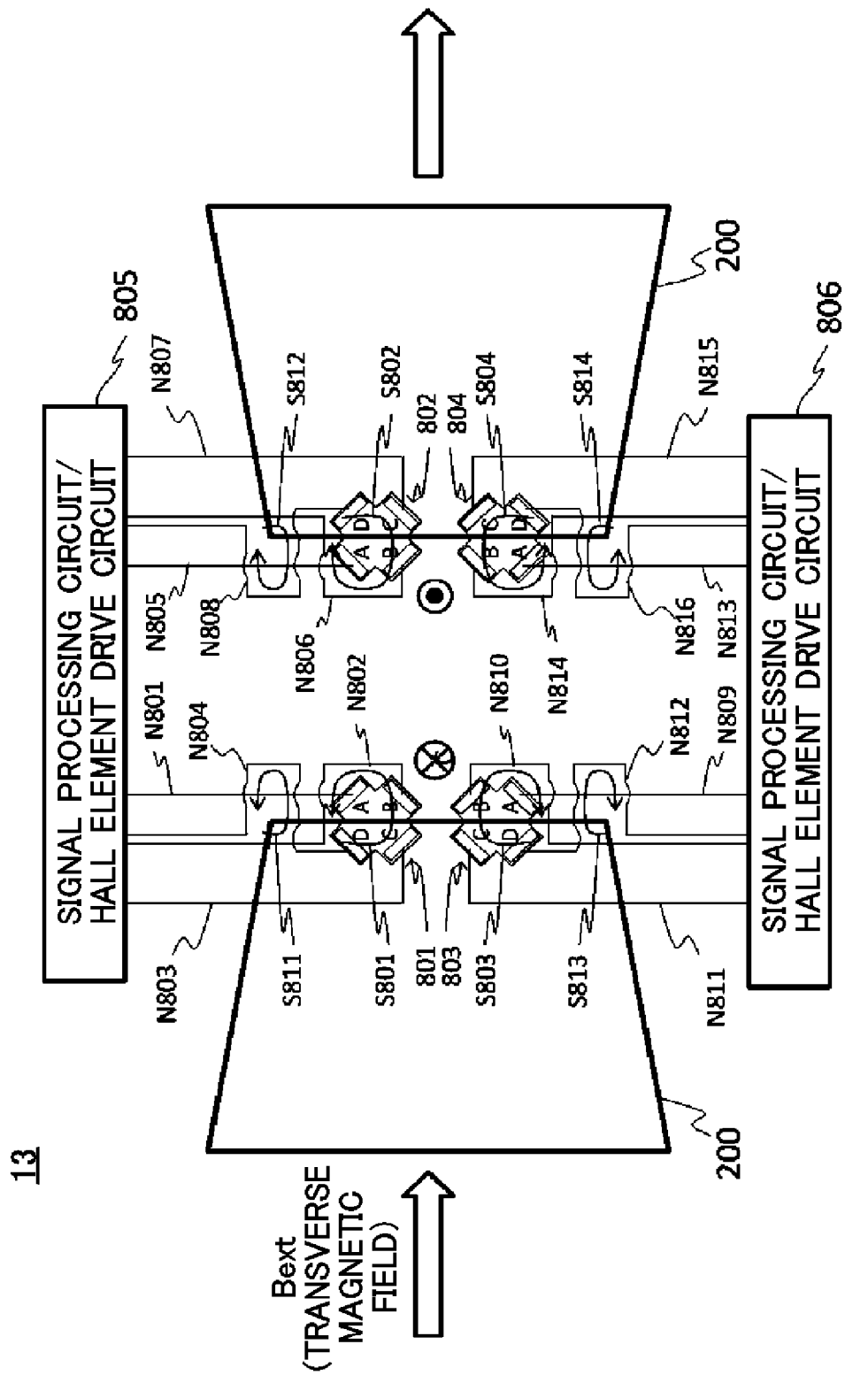
FIG. 8 shows a positional relationship among two pairs of Hall elements, one pair of magnetic converging plates and two pairs of compensation loop regions in a magnetic sensor according to a third variant.

FIG. 8 shows a positional relationship among two pairs of Hall elements 801, 802, 803 and 804, the one pair of magnetic converging plates 200 and two pairs of compensation loop regions S811, S812, S813 and S814 in a magnetic sensor 13 according to a third variant. The magnetic sensor 13 includes a substrate (not shown), the one pair of magnetic converging plates 200, the two pairs of Hall elements 801, 802, 803 and 804 and two pairs of signal processing circuits and Hall element drive circuits 805 and 806.

The substrate (not shown) is for example a silicon substrate, and is configured in a similar manner to the aforementioned substrate 205.

The one pair of magnetic converging plates 200 have isosceles trapezoid shapes, and are arranged on one side and the other side on the substrate (a protection layer included therein) in the left-right direction in the figure, with their respective upper sides facing each other.

The two pairs of Hall elements 801, 802, 803 and 804 are formed on the substrate, but their surfaces are covered by a wiring layer. In the Hall elements 801 and 803 and the Hall elements 802 and 804, the power source terminals A and C and the output terminals B and D are provided symmetrically. The Hall elements 801 and 803 are arranged on the top and bottom sides, respectively, in the figure at an end part of the magnetic converging plate 200 on the left side in the figure, that is, in the proximity of the upper side of the isosceles trapezoid. The Hall elements 802 and 804 are arranged on the top and bottom sides, respectively, in the figure at an end part of the magnetic converging plate 200 on the right side in the figure, that is, in the proximity of the upper side of the isosceles trapezoid. Thereby, the halves of the Hall elements 801 and 803 including the terminals C and D are covered by the magnetic converging plate 200 on the left side in the figure and the halves of the Hall elements 802 and 804 including the terminals C and D are covered by the magnetic converging plate 200 on the right side in the figure.

Due to this arrangement of the two pairs of Hall elements 801, 802, 803 and 804 relative to the one pair of magnetic converging plates 200 and these shapes of the one pair of magnetic converging plates 200, the magnetic fluxes of a transverse magnetic field oriented parallel with the substrate enter the one pair of magnetic converging plates 200 from their bases, are condensed by the tapered shapes of the isosceles trapezoids to be increased in magnetic flux density and exit from the upper sides of the magnetic converging plates 200; thereby, the transverse magnetic field is converted into highly intense vertical magnetic fields, which are to be detected by the Hall elements 801, 802, 803 and 804, respectively, directly under the upper sides.

The two pairs of signal processing circuits and Hall element drive circuits 805 and 806: connect with the power source terminals A and C of the Hall elements 801, 802, 803 and 804 via wires to send signals to drive the Hall elements to the respective ones; and connect with the output terminals B and D of the Hall elements 801, 802, 803 and 804 via wires to receive Hall electromotive forces (output signals including them) output from the respective ones, and perform operations such as addition or subtraction to output the results.

Here, the signal processing circuit and Hall element drive circuit 805 are respectively connected: to the power source terminals A and C of the Hall element 801 by wires N801 and N803, respectively; to the output terminals B and D of the Hall element 801 by wires N802 and N804, respectively; to the power source terminals A and C of the Hall element 802 by wires N805 and N807, respectively; and to the output terminals B and D of the Hall element 802 by wires N806 and N808, respectively. Also, the signal processing circuit and Hall element drive circuit 806 are respectively connected: to the power source terminals A and C of the Hall element 803 by wires N809 and N811, respectively; to the output terminals B and D of the Hall element 803 by wires N810 and N812, respectively; to the power source terminals A and C of the Hall element 804 by wires N813 and N815, respectively; and to the output terminals B and D of the Hall element 804 by wires N814 and N816, respectively.

The wires N802 and N804 (N806 and N808) form a closed loop region S801 (S802) including the Hall element 801 (802) between this and the signal processing circuit and Hall element drive circuit 805. Additionally, between the Hall element 801 (802) and the signal processing circuit and Hall element drive circuit 805, they cross once in a direction parallel with the substrate while being spaced apart from each other in the depth direction of the substrate, and forms the compensation loop region S811 (S812) between the cross and the signal processing circuit and Hall element drive circuit 805, particularly in the proximity of a corner part of the magnetic converging plate 200, the compensation loop region S811 (S812) including therein the corner part in a top view. Here, at least part of a region occupied by the compensation loop region S811 (S812) is covered by the magnetic converging plate 200 in a planar view as seen in the depth direction of the substrate. Likewise, the wires N810 and N812 (N814 and N816) form a closed loop region S803 (S804) including the Hall element 803 (804) between this and the signal processing circuit and Hall element drive circuit 806. Additionally, between the Hall element 803 (804) and the signal processing circuit and Hall element drive circuit 806, they cross once in a direction parallel with the substrate while being spaced apart from each other in the depth direction of the substrate, and forms the compensation loop region S813 (S814) between the cross and the signal processing circuit and Hall element drive circuit 806, particularly in the proximity of a corner part of the magnetic converging plate 200, the compensation loop region S813 (S814) including therein the corner part in a top view. Here, at least part of a region occupied by the compensation loop region S813 (S814) is covered by the magnetic converging plate 200 in a planar view as seen in the depth direction of the substrate.

Figure 9:
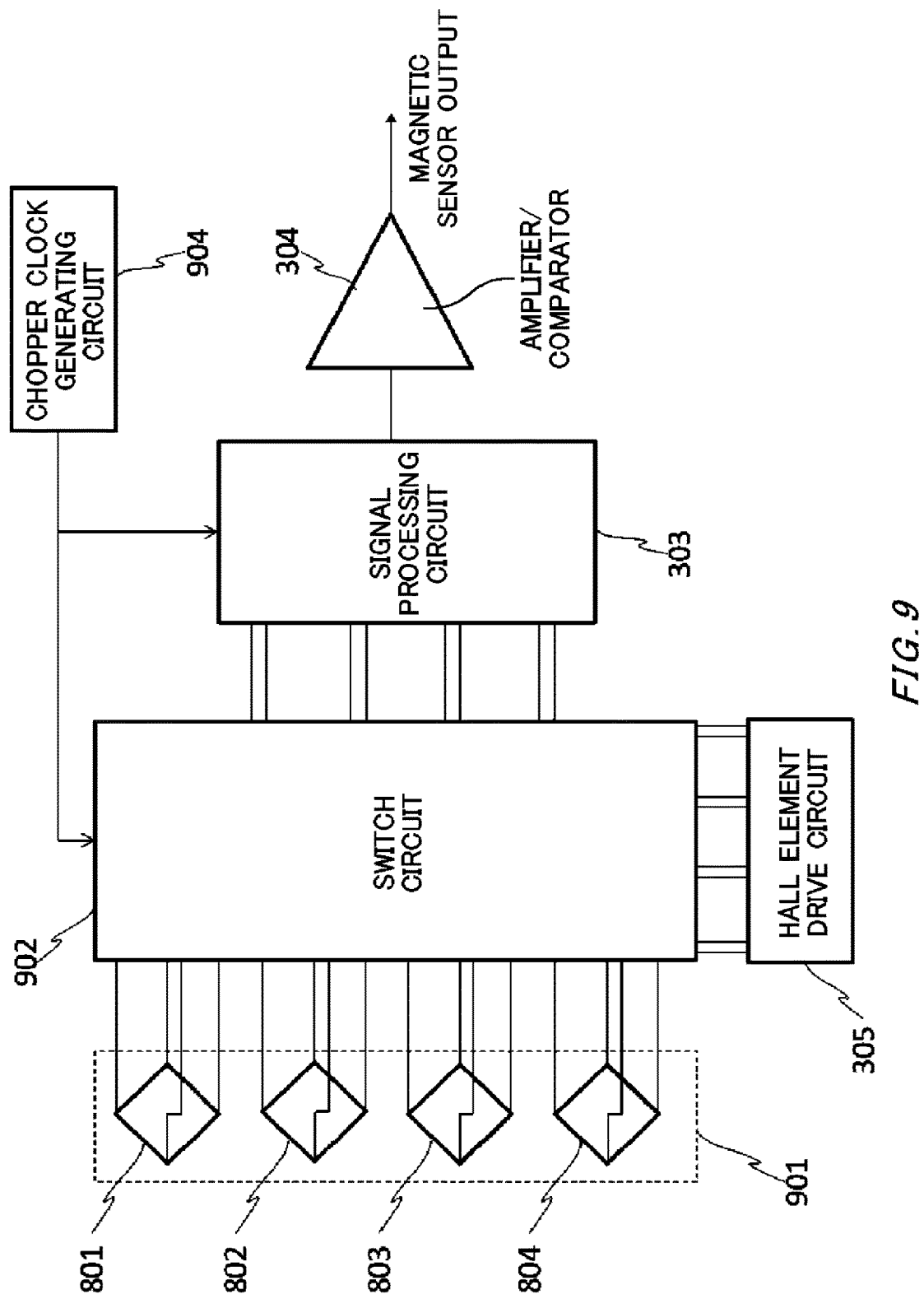
FIG. 9 is a block diagram showing a configuration of a signal processing system in a case where the Hall elements are caused to perform spinning current operation in the magnetic sensor according to the third variant.

FIG. 9 shows a configuration of a signal processing system in a case where the Hall elements are caused to perform spinning current operation in the magnetic sensor 13 according to the third variant. The signal processing system includes a group of Hall elements 901, a switch circuit 902, a chopper clock generating circuit 904, the Hall element drive circuit 305, the signal processing circuit 303 and the amplifier or comparator 304. Here, the Hall element drive circuit 305, the signal processing circuit 303 and the amplifier or comparator 304 are configured and function in similar manners to those mentioned above.

The group of Hall elements 901 include the Hall elements 801, 802, 803 and 804. The Hall elements 801, 802, 803 and 804 are connected to the switch circuit 902 by four respective wires N801 to N804, N805 to N808, N809 to N812, and N813 to N816.

The chopper clock generating circuit 904 generates a chopper clock to input it to the switch circuit 902, the Hall element drive circuit 305 and the signal processing circuit 303.

The switch circuit 902 operates according to the chopper clock input from the chopper clock generating circuit 904 to switch connection of the power source terminals A and C in the Hall elements 801, 802, 803 and 804 to the Hall element drive circuit 305 and additionally switch connection of the output terminals B and D to the signal processing circuit 303; thereby, it performs so-called spinning current operation.

Spinning current operation is a suitable method for taking out only signals of Hall electromotive forces by removing element-specific offset components included in output signals output from Hall elements. In spinning current operation, the switch circuit 902 reverses the directions of currents supplied to the Hall element 801, 802, 803 and 804, respectively, to detect output signals. Thereby, the polarity of a signal of a Hall electromotive force relative to an offset component is reversed in an output signal. In view of this, by calculating the difference in respective output signals before and after reversal of the directions of currents, only a signal of a Hall electromotive force can be taken out.

Figure 10:
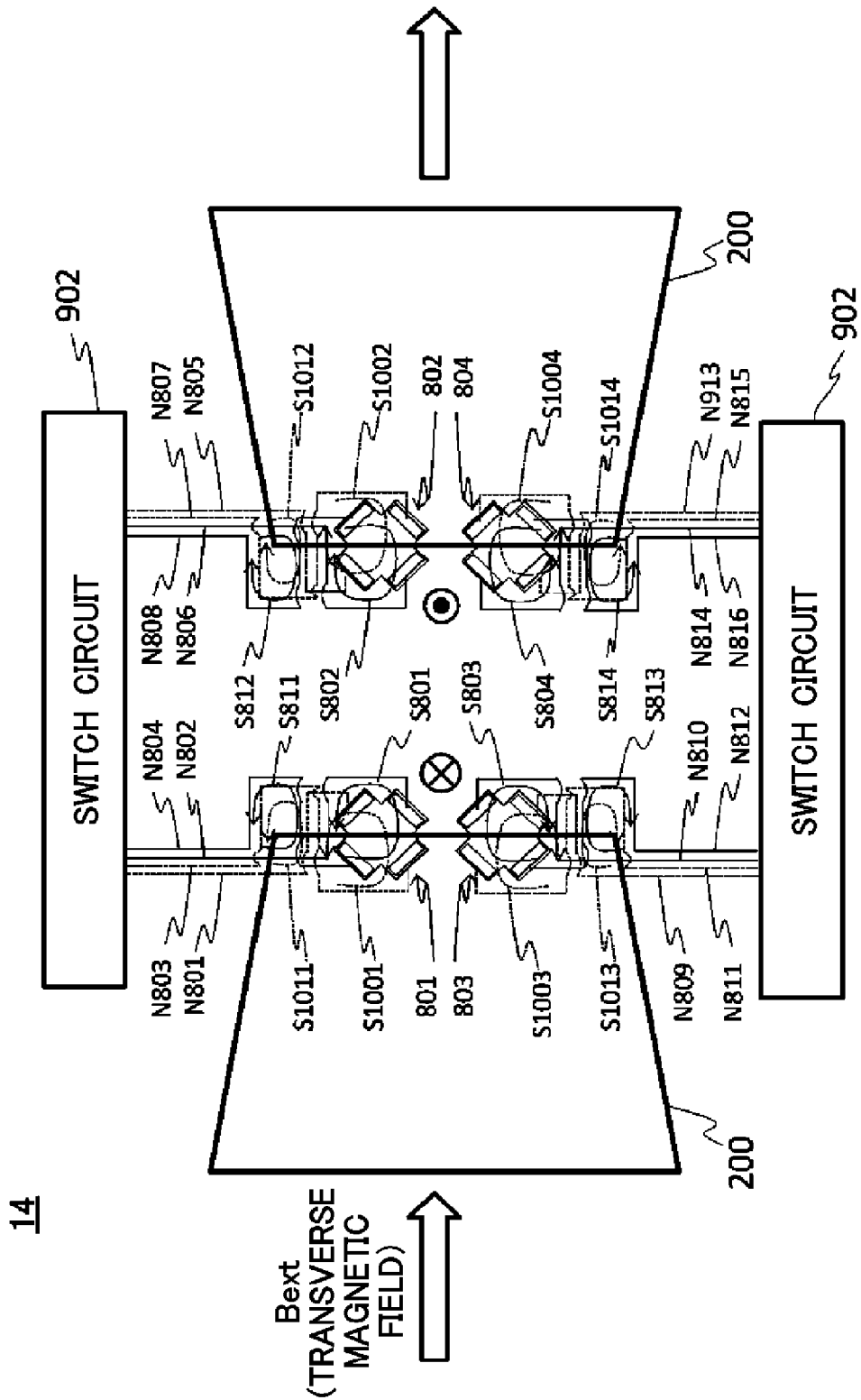
FIG. 10 shows a positional relationship among two pairs of Hall elements, one pair of magnetic converging plates and two pairs of compensation loop regions in a magnetic sensor according to a fourth variant.

FIG. 10 shows a positional relationship among the two pairs of Hall elements 801, 802, 803 and 804, the one pair of magnetic converging plates 200 and two pairs of compensation loop regions S1011, S1012, S1013 and S1014 in a magnetic sensor 14 according to a fourth variant. The magnetic sensor 14 includes a substrate (not shown), the one pair of magnetic converging plates 200, the two pairs of Hall elements 801, 802, 803 and 804, the signal processing system in FIG. 9; thereby, it is configured to be capable of spinning current operation. Note that in FIG. 10, only the switch circuit 902 included in the signal processing system in FIG. 9 is shown. Because in spinning current operation, the power source terminals A and C of each Hall element also function as output terminals, not only induced electromotive forces caused to a closed loop region formed by wires connected with the terminals B and D, but also induced electromotive forces caused to a closed loop region formed by wires connected with the terminals A and C need to be compensated. Accordingly, in the magnetic sensor 14 according to the present variant, compensation loop regions S1011, S1012, S1013 and S1014 are further formed in the wires N801, N803, N805, N807, N809, N811, N813 and N815 respectively connected with the power source terminals A and C of the Hall elements 801, 802, 803 and 804 in the magnetic sensor 13 according to the third variant.

Here, the signal processing circuit 303 is connected via the switch circuit 902 respectively: to the power source terminals A and C of the Hall element 801 by the wires N801 and N803, respectively (to the power source terminals B and D of the Hall element 801 by the wires N802 and N804, respectively); and to the power source terminals A and C of the Hall element 802 by the wires N805 and N807, respectively (to the power source terminals B and D of the Hall element 802 by the wires N806 and N808, respectively). Also, the signal processing circuit 303 is connected via the switch circuit 902 respectively: to the power source terminals A and C of the Hall element 803 by the wires N809 and N811, respectively (to the power source terminals B and D of the Hall element 803 by the wires N810 and N812, respectively); and to the power source terminals A and C of the Hall element 804 by the wires N813 and N815, respectively (to the power source terminals B and D of the Hall element 804 by the wires N814 and N816, respectively).

The wires N801 and N803 (N805 and N807) form a closed loop region S1001 (S1002) including the Hall element 801 (802) between this and the switch circuit 902 (that is, the signal processing circuit 303). Additionally, between the Hall element 801 (802) and the switch circuit 902, they cross once in a direction parallel with the substrate while being spaced apart from each other in the depth direction of the substrate, and forms the compensation loop region S1011 (S1012) between the cross and the switch circuit 902, particularly in the proximity of a corner part of the magnetic converging plate 200, the compensation loop region S1011 (S1012) including therein the corner part in a top view. Here, at least part of a region occupied by the compensation loop region S1011 (S1012) is covered by the magnetic converging plate 200 in a planar view as seen in the depth direction of the substrate. Also, the compensation loop region S1011 (S1012) overlaps the compensation loop region S811 (S812) in a planar view in the depth direction of the substrate. Likewise, the wires N809 and N811 (N813 and N815) form a closed loop region S1003 (S1004) including the Hall element 803 (804) between this and the switch circuit 902 (that is, the signal processing circuit 303). Additionally, between the Hall element 803 (804) and the switch circuit 902, they cross once in a direction parallel with the substrate while being spaced apart from each other in the depth direction of the substrate, and forms the compensation loop region S1013 (S1014) between the cross and the switch circuit 902, particularly in the proximity of a corner part of the magnetic converging plate 200, the compensation loop region S1013 (S1014) including therein the corner part in a top view. Here, at least part of a region occupied by the compensation loop region S1013 (S1014) is covered by the magnetic converging plate 200 in a planar view as seen in the depth direction of the substrate. Also, the compensation loop region S1013 (S1014) overlaps the compensation loop region S813 (S814) in a planar view in the depth direction of the substrate.

Thereby, if output signals of Hall elements are received from the terminals A and C after switching between the power source terminals A and C and the output terminals B and D of the Hall elements 801, 802, 803 and 804 due to spinning current operation, the response characteristics of the magnetic sensor 14 can always be compensated by cancelling out induced electromotive forces caused to the closed loop regions S1001, S1002, S1003 and S1004 by induced electromotive forces caused to the compensation loop regions S1011, S1012, S1013 and S1014.

Although in the magnetic sensor 14 according to the present variant, compensation loop regions for spinning current operation are shown as an example, this can be applied likewise also in other embodiments and variants. Because the present variant allow inductance components to be cancelled out, a power source voltage at the time of switching between the power source terminals A and C and the output terminals B and D can be stabilized quickly, and this leads to quick stabilization of an output voltage. Furthermore, the present variant allows inductance components formed by wires of the power source terminals A and C to be cancelled out, and allows reduction of common-mode noise in sensor outputs.

Figure 11:
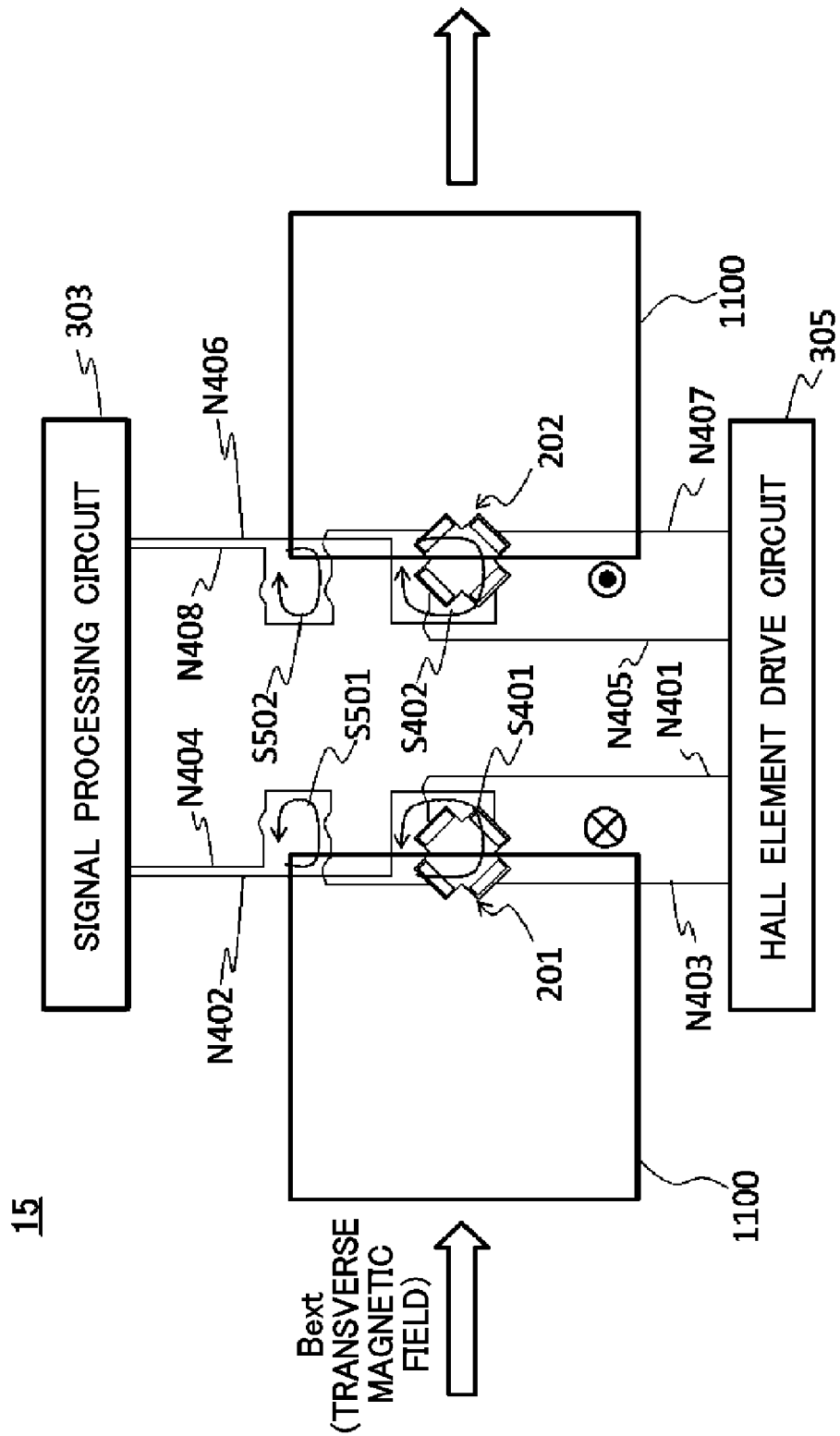
FIG. 11 shows a positional relationship among one pair of Hall elements, one pair of magnetic converging plates and one pair of compensation loop regions in a magnetic sensor according to a fifth variant.

FIG. 11 shows a positional relationship among the one pair of Hall elements 201 and 202, one pair of magnetic converging plates 1100 and the one pair of compensation loop regions S501 and S502 in a magnetic sensor 15 according to a fifth variant. The magnetic sensor 15 is obtained by altering the shapes of the one pair of magnetic converging plates 1100 to square in the magnetic sensor 10 according to the embodiment shown in FIG. 5A. The compensation loop regions S501 and S502 are desirably arranged such that the directions of magnetic fields entering them become the same as directions of magnetic fields entering the closed loop regions S401 and S402 to which compensation target induced electromotive forces are generated. Also, although in the present variant, the shape of the magnetic converging plate 200 is square, it may for example be any shape such as rectangle, octagon, circle or the like.

Figure 12:
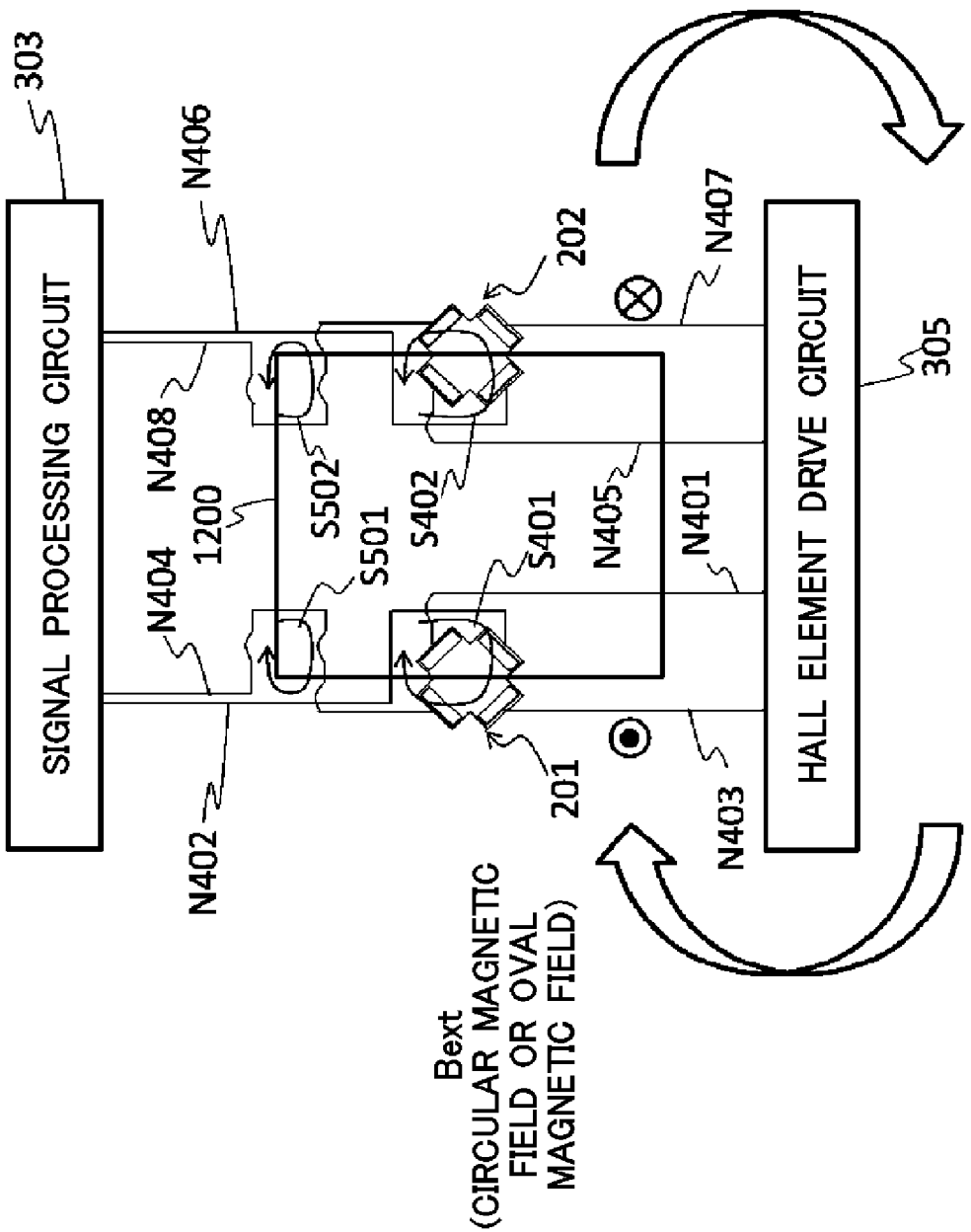
FIG. 12 shows a positional relationship among one pair of Hall elements, one magnetic converging plate and one pair of compensation loop regions in a magnetic sensor according to a sixth variant.

FIG. 12 shows a positional relationship among the one pair of Hall elements 201 and 202, one magnetic converging plate 1200 and the one pair of compensation loop regions S501 and S502 in a magnetic sensor 16 according to a sixth variant. The magnetic sensor 16 is obtained using, in the magnetic sensor 15 according to the fifth variant shown in FIG. 11, the one magnetic converging plate 1200 in place of the one pair of magnetic converging plates 200, and arranging: the Hall elements 201 and 202 in the proximity of one end part of the magnetic converging plate 1200 (an end part on the left side in the figure) and the proximity of another end part of the magnetic converging plate 1200 (an end part on the right side in the figure), respectively; and the compensation loop regions S501 and S502 in the proximity of one corner part of the magnetic converging plate 1200 (an upper left corner part in the figure) and the proximity of another corner part of the magnetic converging plate 1200 (an upper right corner part in the figure), respectively. This magnetic sensor 16 allows a circular magnetic field or an oval magnetic field to be detected.

With this arrangement of the Hall elements 201 and 202 relative to the magnetic converging plate 1200, for example, a magnetic field enters the Hall element 201 from the far side toward the near side on the paper surface, and a magnetic field enters the Hall element 202 from the near side toward the far side on the paper surface.

Thereby, because while an induced electromotive force is generated clockwise to the closed loop region S401 formed by the wires N402 and N404 including the Hall element 201, an induced electromotive force is caused clockwise also to the compensation loop region S501, the induced electromotive force caused to the closed loop region S401 can be compensated by the compensation loop region S501. Also, because while an induced electromotive force is generated counterclockwise to the closed loop region S402 formed by the wires N406 and N408 including the Hall element 202, an induced electromotive force is caused counterclockwise also to the compensation loop region S502, the induced electromotive force caused to the closed loop region S402 can be compensated by the compensation loop region S502.

Figure 13:
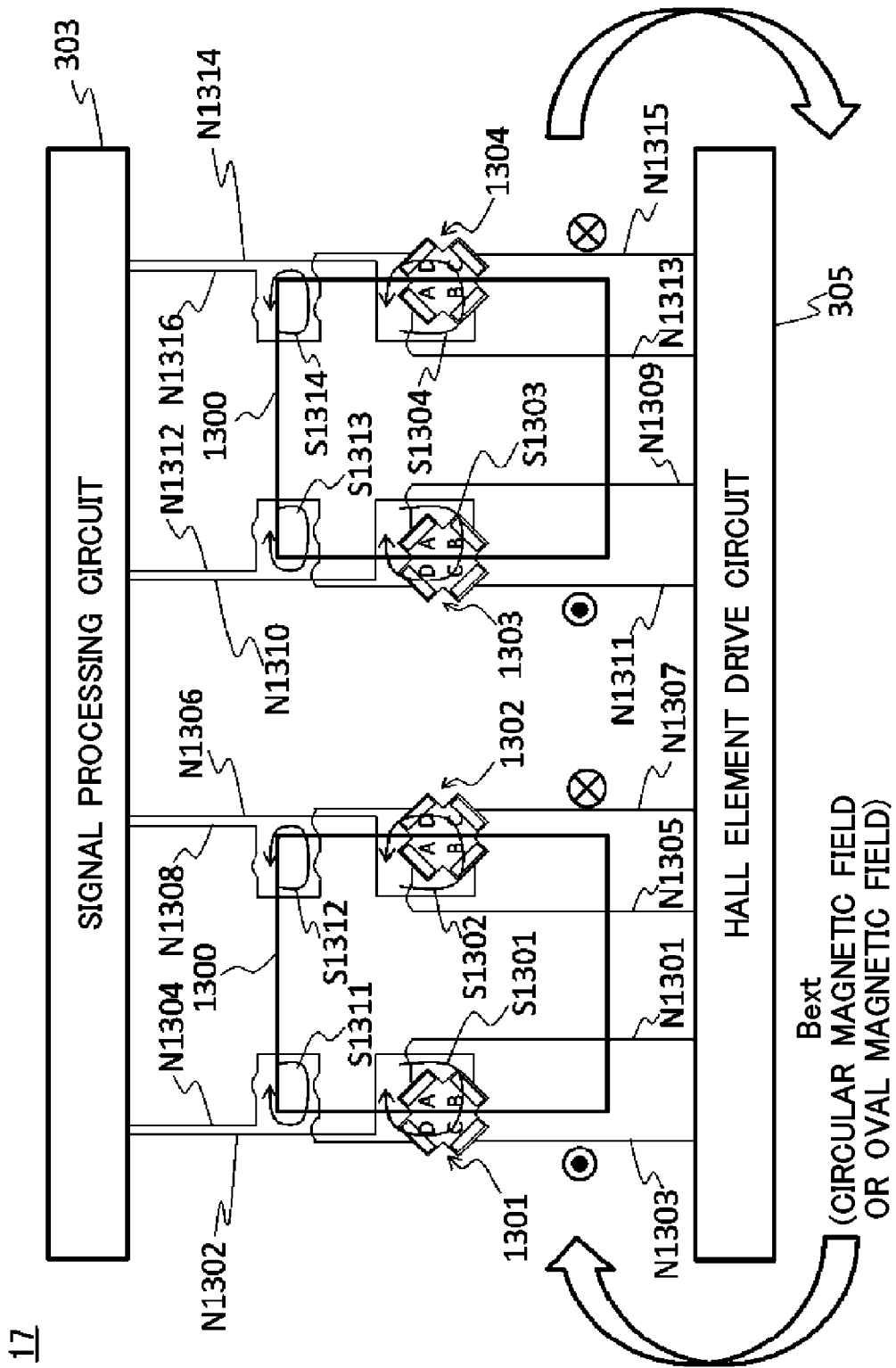
FIG. 13 shows a positional relationship among two pairs of Hall elements, one pair of magnetic converging plates and two pairs of compensation loop regions in a magnetic sensor according to a seventh variant.

FIG. 13 shows a positional relationship among two pairs of Hall elements 1301, 1302, 1303 and 1304, one pair of magnetic converging plates 1300 and two pairs of compensation loop regions S1311, S1312, S1313 and S1314 in a magnetic sensor 17 according to a seventh variant. The magnetic sensor 17 includes a substrate (not shown), the one pair of magnetic converging plates 1300, the two pairs of Hall elements 1301, 1302, 1303 and 1304, the Hall element drive circuit 305 and the signal processing circuit 303. The magnetic sensor 17 is obtained using, in the magnetic sensor 13 according to the third variant shown in FIG. 8, the one pair of rectangular magnetic converging plates 1300 in place of the one pair of magnetic converging plates 200, and similar to the magnetic sensor 16 according to the sixth variant shown in FIG. 12, arranging: the Hall elements 1301, 1302, 1303 and 1304 in the proximity of one end part of each among the one pair of magnetic converging plates 1300 (end parts on the left side in the figure) and the proximity of another end part of each among the one pair of magnetic converging plates 1300 (end parts on the right side in the figure); and compensation loop regions S1311, S1312, S1313 and S1314 in the proximity of one corner part of each among the one pair of magnetic converging plates 1300 (upper left corner parts in the figure) and the proximity of another corner part of each among the one pair of magnetic converging plates 1300 (upper right corner parts in the figure). Also, in other words, the magnetic sensor 17 is equivalent to the one obtained by providing two sets of the one pair of Hall elements, the one magnetic converging plate and the one pair of compensation loop regions in the magnetic sensor 16 according to the sixth variant shown in FIG. 12. This magnetic sensor 17 allows a circular magnetic field or an oval magnetic field to be detected.

The one pair of magnetic converging plates 1300 are square, and are arranged on one side and the other side on the substrate (a protection layer included therein) in the left-right direction in the figure, with one side of each of them facing one side of the other.

The two pairs of Hall elements 1301, 1302, 1303 and 1304 are formed on the substrate, but their surfaces are covered by a wiring layer. Between the Hall elements 1301 and 1304 and between the Hall elements 1302 and 1303, the power source terminals A and C and the output terminals B and D are provided symmetrically. The Hall elements 1301 and 1302 are arranged at a left end part and a right end part, respectively, of the magnetic converging plate 1300 on the left side in the figure. The Hall elements 1303 and 1304 are arranged at a left end part and a right end part, respectively, of the magnetic converging plate 1300 on the right side in the figure. Thereby, the halves of the Hall elements 1301 and 1302 including the terminals A and B are covered by the magnetic converging plate 1300 on the left side in the figure and the halves of the Hall element 1303 and 1304 including the terminals A and B are covered by the magnetic converging plate 1300 on the right side in the figure.

The Hall element drive circuit 305 connects with the power source terminals A and C of the Hall elements 1301, 1302, 1303 and 1304 via wires to send signals to drive the Hall elements to the respective ones. Here, the Hall element drive circuit 305 is respectively connected: to the power source terminals A and C of the Hall element 1301 by wires N1301 and N1303, respectively; to the power source terminals A and C of the Hall element 1302 by wires N1305 and N1307, respectively; to the power source terminals A and C of the Hall element 1303 by wires N1309 and N1311, respectively; and to the power source terminals A and C of the Hall element 1304 by wires N1313 and N1315, respectively.

The signal processing circuit 303 connects with the output terminals B and D of the Hall elements 1301, 1302, 1303 and 1304 via wires to receive Hall electromotive forces (output signals including them) output from the respective ones, and performs operations such as addition or subtraction and outputs the results. Here, the signal processing circuit 303 is respectively connected: to the output terminals B and D of the Hall element 1301 by wires N1302 and N1304, respectively; to the output terminals B and D of the Hall element 1302 by wires N1306 and N1308, respectively; to the output terminals B and D of the Hall element 1303 by wires N1310 and N1312, respectively; and to the output terminals B and D of the Hall element 1304 by wires N1314 and N1316, respectively.

The wires N1302 and N1304 (N1306 and N1308) form a closed loop region S1301 (S1302) including the Hall element 1301 (1302) between this and the signal processing circuit 303. Additionally, between the Hall element 1301 (1302) and the signal processing circuit 303, they cross once in a direction parallel with the substrate while being spaced apart from each other in the depth direction of the substrate, and forms the compensation loop region S1311 (S1312) between the cross and the signal processing circuit 303, particularly in the proximity of a left corner part (right corner part) of the magnetic converging plate 1300 on the left side in the figure, the compensation loop region S1311 (S1312) including therein the corner part in a top view. Here, at least part of a region occupied by the compensation loop region S1311 (S1312) is covered by the magnetic converging plate 1300 in a planar view as seen in the depth direction of the substrate. Likewise, the wires N1310 and N1312 (N1314 and N1316) form a closed loop region S1303 (S1304) including the Hall element 1303 (1304) between this and the signal processing circuit 303. Additionally, between the Hall element 1303 (1304) and the signal processing circuit 303, they cross once in a direction parallel with the substrate while being spaced apart from each other in the depth direction of the substrate, and forms the compensation loop region S1313 (S1314) between the cross and the signal processing circuit 303, particularly in the proximity of a left corner part (right corner part) of the magnetic converging plate 1300 on the right side in the figure, the compensation loop region S1313 (S1314) including therein the corner part in a top view. Here, at least part of a region occupied by the compensation loop region S1313 (S1314) is covered by the magnetic converging plate 1300 in a planar view as seen in the depth direction of the substrate.

With this arrangement of the two pairs of Hall elements 1301, 1302, 1303 and 1304 relative to the one pair of magnetic converging plates 1300, for example: in the proximity of a left end part of the magnetic converging plate 1300 on the left side in the figure, a magnetic field enters the Hall element 1301 from the far side toward the near side on the paper surface; in the proximity of a right end part of the magnetic converging plate 1300 on the left side in the figure, a magnetic field enters the Hall element 1302 from the near side toward the far side on the paper surface; in the proximity of a left end part of the magnetic converging plate 1300 on the right side in the figure, a magnetic field enters the Hall element 1303 from the far side toward the near side on the paper surface; and in the proximity of a right end part of the magnetic converging plate 1300 on the right side in the figure, a magnetic field enters the Hall element 1304 from the near side toward the far side on the paper surface.

Thereby, because while an induced electromotive force is generated clockwise to the closed loop region S1301 formed by the wires N1302 and N1304 including the Hall element 1301, an induced electromotive force is caused clockwise also to the compensation loop region S1311, the induced electromotive force caused to the closed loop region S1301 can be compensated by the compensation loop region S1311. Also, because while an induced electromotive force is generated counterclockwise to the closed loop region S1302 formed by the wires N1306 and N1308 including the Hall element 1302, an induced electromotive force is caused counterclockwise also to the compensation loop region S1312, the induced electromotive force caused to the closed loop region S1302 can be compensated by the compensation loop region S1312. Likewise, because while an induced electromotive force is generated clockwise to the closed loop region S1303 formed by the wires N1310 and N1312 including the Hall element 1303, an induced electromotive force is caused clockwise also to the compensation loop region S1313, the induced electromotive force caused to the closed loop region S1303 can be compensated by the compensation loop region S1313. Also, because while an induced electromotive force is generated counterclockwise to the closed loop region S1304 formed by the wires N1314 and N1316 including the Hall element 1304, an induced electromotive force is caused counterclockwise also to the compensation loop region S1314, the induced electromotive force caused to the closed loop region S1304 can be compensated by the compensation loop region S1314.

Although in the present variant, an arrangement example about one pair of magnetic converging plates and two pairs of Hall elements, spinning current operation applied to the magnetic sensor 14 according to the fourth variant can also be applied. Also, the shapes of magnetic converging plates, the arrangements of Hall elements and compensation loop regions, etc., that are explained in the aforementioned embodiments and variants can be combined in any manner.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As is obvious from the explanation provided above, a magnetic sensor can be realized according to embodiments of the present invention.

EXPLANATION OF REFERENCE SYMBOLS 10, 11, 12, 13, 14, 15, 16, 17: magnetic sensor; 100, 201, 202, 801, 802, 803, 804, 1301, 1302, 1303, 1304: symmetrical Hall element; 101, 102, 103, 104: Hall element terminal; 105: magnetically sensitive part; 200, 1100, 1200, 1300: magnetic converging plate; 203: protection film; 204: wiring layer; 205: substrate; 303: signal processing circuit; 304: operation amplifier; 305: Hall element drive circuit; N401, N402, N403, N404, N405, N406, N407, N408, N801, N802, N803, N804, N805, N806, N807, N808, N809, N810, N811, N812, N813, N814, N815, N816, N1301, N1302, N1303, N1304, N1305, N1306, N1307, N1308, N1309, N1310, N1311, N1312, N1313, N1314, N1315, N1316: wire; 805, 806: signal processing circuit and Hall element drive circuit; 901: group of Hall elements; 902: switch circuit; 904: chopper clock generating circuit; S401, S402, S801, S802, S803, S804, S1001, S1002, S1003, S1004, S1301, S1302, S1303, S1304: closed loop region; S501, S502, S811, S812, S813, S814, S1011, S1012, S1013, S1014, S1311, S1312, S1313, S1314: compensation loop region

What is claimed is:

1. A magnetic sensor comprising:
a magnetic converging plate;
an electromagnetic converting element disposed on one surface side of the magnetic converging plate;
at least two wires that connect to the electromagnetic converting element; and
a circuit that connects to the at least two wires and receives a signal from the electromagnetic converting element, wherein
between the electromagnetic converting element and the circuit, the at least two wires cross while being spaced apart from each other in a direction perpendicular to the one surface of the magnetic converging plate to form a compensation loop between a cross of the at least two wires and the circuit, and
in a planar view as seen in a direction perpendicular to the one surface of the magnetic converging plate, at least part of a region occupied by the compensation loop is covered by the magnetic converging plate.

2. The magnetic sensor according to claim 1, wherein at least part of the region occupied by the compensation loop is disposed on the one surface side of a corner part of the magnetic converging plate.

3. The magnetic sensor according to claim 1, wherein the compensation loop cancels out an induced electromotive force caused to the at least two wires between the electromagnetic converting element and the cross of the at least two wires.

4. The magnetic sensor according to claim 1, wherein in the planar view as seen in the direction perpendicular to the one surface of the magnetic converging plate, at least part of the electromagnetic converting element is covered by the magnetic converging plate.

5. The magnetic sensor according to claim 1, further comprising:
an other magnetic converging plate disposed spaced apart from the magnetic converging plate;
an other electromagnetic converting element disposed on one surface side of the other magnetic converging plate; and
at least two other wires connecting with the other electromagnetic converting element, wherein
the circuit further connects with the two other wires to receive a signal from the other electromagnetic converting element,
between the other electromagnetic converting element and the circuit, the two other wires cross in a direction parallel with one surface of the other magnetic converging plate while being spaced apart from each other in a direction crossing one surface of the other magnetic converging plate, and form an other compensation loop between a cross of the two other wires and the circuit, and
the magnetic converging plate, the electromagnetic converting element and the compensation loop, and the other magnetic converging plate, the other electromagnetic converting element and the other compensation loop are arranged symmetrically about a direction parallel with one surface of the magnetic converging plate.

6. The magnetic sensor according to claim 5, wherein the circuit calculates a difference in respective output signals of the electromagnetic converting element and the other electromagnetic converting element.

7. A magnetic sensor comprising:
a magnetic converging plate formed on a substrate;
an impurity diffusion layer formed on the substrate;
first to fourth terminals connecting with the impurity diffusion layer;
a first wire connecting with the first terminal;
a third wire connecting with the third terminal arranged facing the first terminal;
a second wire connecting with the second terminal; and
a fourth wire connecting with the fourth terminal arranged facing the second terminal, wherein
the first wire and the third wire cross while being spaced apart from each other in a direction perpendicular to the substrate and form a first compensation loop after the cross, and at least part of a region occupied by the first compensation loop is covered by the magnetic converging plate in a planar view as seen in the direction perpendicular to the substrate.

8. The magnetic sensor according to claim 7, wherein the second wire and the fourth wire cross while being spaced apart from each other in the direction perpendicular to the substrate and form a second compensation loop after the cross, and at least part of a region occupied by the second compensation loop is covered by the magnetic converging plate in a planar view as seen in the direction perpendicular to substrate.

9. The magnetic sensor according to claim 8, wherein the regions occupied respectively by the first compensation loop and the second compensation loop at least partially overlap in the direction perpendicular to the substrate.

10. The magnetic sensor according to claim 8, further comprising a switch connecting with the first to fourth wires, wherein
the first compensation loop is formed between a cross of the first wire and the third wire and the switch, and
the second compensation loop is formed between a cross of the second and fourth wires and the switch.

11. The magnetic sensor according to claim 8, wherein the impurity diffusion layer is an electromagnetic converting element.

12. The magnetic sensor according to claim 7, wherein the first terminal and the second terminal face each other, and the third terminal and the fourth terminal face each other.

13. The magnetic sensor according to claim 7, wherein the first to fourth terminals and the first to fourth wires are integrated on the substrate.

14. The magnetic sensor according to claim 7, wherein a first state in which the first and third terminals are power source terminals and the second and fourth terminals are output terminals, and a second state in which the first and third terminals are output terminals and the second and fourth terminals are power source terminals are switched over from one to the other alternately.

\* \* \* \* \*